(12) United States Patent
Ema et al.

(10) Patent No.: US 10,373,952 B2
(45) Date of Patent: Aug. 6, 2019

(54) SEMICONDUCTOR DEVICE

(71) Applicant: MIE FUJITSU SEMICONDUCTOR LIMITED, Kuwana-shi, Mie (JP)

(72) Inventors: Taiji Ema, Inabe (JP); Makoto Yasuda, Kuwana (JP); Kazushi Fujita, Kuwana (JP)

(73) Assignee: MIE FUJITSU SEMICONDUCTOR LIMITED, Kuwana (JP)

( * ) Notice: Subject to any disclaimer, the term of this patent is extended or adjusted under 35 U.S.C. 154(b) by 0 days.

(21) Appl. No.: 15/042,603

(22) Filed: Feb. 12, 2016

(65) Prior Publication Data

US 2016/0284696 A1   Sep. 29, 2016

(30) Foreign Application Priority Data

Mar. 26, 2015 (JP) ................................ 2015-064026

(51) Int. Cl.
| | |
|---|---|
| *H01L 27/088* | (2006.01) |
| *H01L 29/423* | (2006.01) |
| *H01L 29/06* | (2006.01) |
| *H01L 29/78* | (2006.01) |
| *H01L 29/10* | (2006.01) |
| *H01L 21/8234* | (2006.01) |

(52) U.S. Cl.
CPC .... *H01L 27/088* (2013.01); *H01L 21/823462* (2013.01); *H01L 21/823493* (2013.01); *H01L 29/0607* (2013.01); *H01L 29/105* (2013.01); *H01L 29/1083* (2013.01); *H01L 29/42364* (2013.01); *H01L 29/7833* (2013.01)

(58) Field of Classification Search
None
See application file for complete search history.

(56) References Cited

U.S. PATENT DOCUMENTS 8,134,159 B2 * 3/2012 Hokazono ........... H01L 21/2652
  257/77
9,496,261 B2 * 11/2016 Shifren ........... H01L 21/823807
(Continued)

FOREIGN PATENT DOCUMENTS

| JP | 11-214527 A | 8/1999 |
|---|---|---|
| JP | 2004-39775 A | 2/2004 |

(Continued)

OTHER PUBLICATIONS

Office Action dated Sep. 4, 2018, issued in counterpart Japanese Application No. 2015-064026, with English machine translation. (7 pages).

(Continued)

*Primary Examiner* — Walter H Swanson
*Assistant Examiner* — Kien C Ly
(74) *Attorney, Agent, or Firm* — Westerman, Hattori, Daniels & Adrian, LLP

(57) ABSTRACT

A semiconductor device includes first and second transistors connected to the same power supply. Each of the first and second transistors includes, under a channel region of a low concentration provided between a source region and a drain region of a first conductivity type, an impurity region of a second conductivity type having a higher concentration. The thickness of the gate insulating film in one of the first and second transistors is made larger than the thickness of the gate insulating film in the other one.

19 Claims, 33 Drawing Sheets

(56) References Cited

U.S. PATENT DOCUMENTS

| | | | |
|---|---|---|---|
| 2004/0004229 A1 | 1/2004 | Akiyama | |
| 2007/0235809 A1 | 10/2007 | Hayano | |
| 2008/0036014 A1* | 2/2008 | Akamatsu | H01L 21/823462 257/391 |
| 2011/0074498 A1* | 3/2011 | Thompson | H01L 21/823412 327/543 |
| 2011/0248352 A1* | 10/2011 | Shifren | H01L 21/823807 257/369 |
| 2012/0080759 A1 | 4/2012 | Ema et al. | |
| 2013/0307080 A1* | 11/2013 | Chih | H01L 21/823412 257/368 |
| 2014/0001571 A1* | 1/2014 | Zhao | H01L 21/823412 257/392 |
| 2014/0084385 A1* | 3/2014 | Hoffmann | H01L 29/7833 257/402 |
| 2014/0091397 A1 | 4/2014 | Ema et al. | |
| 2015/0061037 A1* | 3/2015 | Cai | H01L 27/088 257/401 |
| 2016/0094217 A1* | 3/2016 | Garg | H03K 17/687 327/108 |

FOREIGN PATENT DOCUMENTS

| | | |
|---|---|---|
| JP | 2007-281178 A | 10/2007 |
| JP | 2012-79746 A | 4/2012 |
| JP | 2014-72512 A | 4/2014 |

OTHER PUBLICATIONS

Office Action dated May 28, 2018, issued in counterapart Chinese Application No. 201610109054.0, with English translation. (14 pages).

\* cited by examiner

SEMICONDUCTOR DEVICE

CROSS-REFERENCE TO RELATED APPLICATION

This application is based upon and claims the benefit of priority of the prior Japanese Patent Application No. 2015-064026, filed on Mar. 26, 2015, the entire contents of which are incorporated herein by reference.

FIELD

The embodiments discussed herein relate to a semiconductor device.

BACKGROUND

There is known a technique of operating, at the same power supply voltage, a MOS (Metal Oxide Semiconductor) type field effect transistor group having different thicknesses of gate insulating films, different threshold voltages which are controlled by impurity concentration in a channel region directly under the gate insulating film, and different off currents, by using the transistor group for an internal circuit and a power supply protection circuit.

Further, for the MOS type field effect transistor, there is known a technique of controlling the threshold voltage by forming the channel region to be non-doped or to have a very low impurity concentration and providing an impurity region having a higher concentration than the channel region, under such a channel region. This technique is expected as a technique of suppressing the variation of the threshold voltage and achieving power supply voltage reduction and power consumption reduction.

See, for example, Japanese Laid-open Patent Publication Nos. 2004-39775 and No. 2014-72512.

Meanwhile, the off current of a transistor includes the sum of sub-threshold leak current and junction leak current.

In a transistor having an impurity region of a higher concentration than the impurity concentration of the channel region, provided under the channel region, the threshold voltage is controlled by the adjustment of the concentration of the higher concentration impurity region. In this case, since the sub-threshold leak current and the junction leak current change according to the concentration of the impurity region, there is a possibility that resultantly the off current including the sum of the both leak currents is not suppressed low. It is preferable to reduce the off current from the viewpoint of the power consumption reduction.

SUMMARY

According to an aspect, there is provided a semiconductor device including a first transistor and a second transistor connected to a first power supply, the first transistor including: a first gate insulating film provided over a semiconductor substrate; a first gate electrode provided over the first gate insulating film; a first source region and a first drain region which are provided in the semiconductor substrate respectively on both sides of the first gate electrode and contain impurities of a first conductivity type; a first channel region provided in the semiconductor substrate between the first source region and the first drain region; and a first impurity region which is provided in the semiconductor substrate under the first channel region and contains impurities of a second conductivity type different from the first conductivity type in a higher concentration than the first channel region, and the second transistor including: a second gate insulating film provided over the semiconductor substrate; a second gate electrode provided over the second gate insulating film; a second source region and a second drain region which are provided in the semiconductor substrate respectively on both sides of the second gate electrode and contain impurities of the first conductivity type; a second channel region provided in the semiconductor substrate between the second source region and the second drain region; and a second impurity region which is provided in the semiconductor substrate under the second channel region and contains impurities of the second conductivity type in a higher concentration than the second channel region, wherein a thickness of the first gate insulating film is larger than a thickness of the second gate insulating film.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
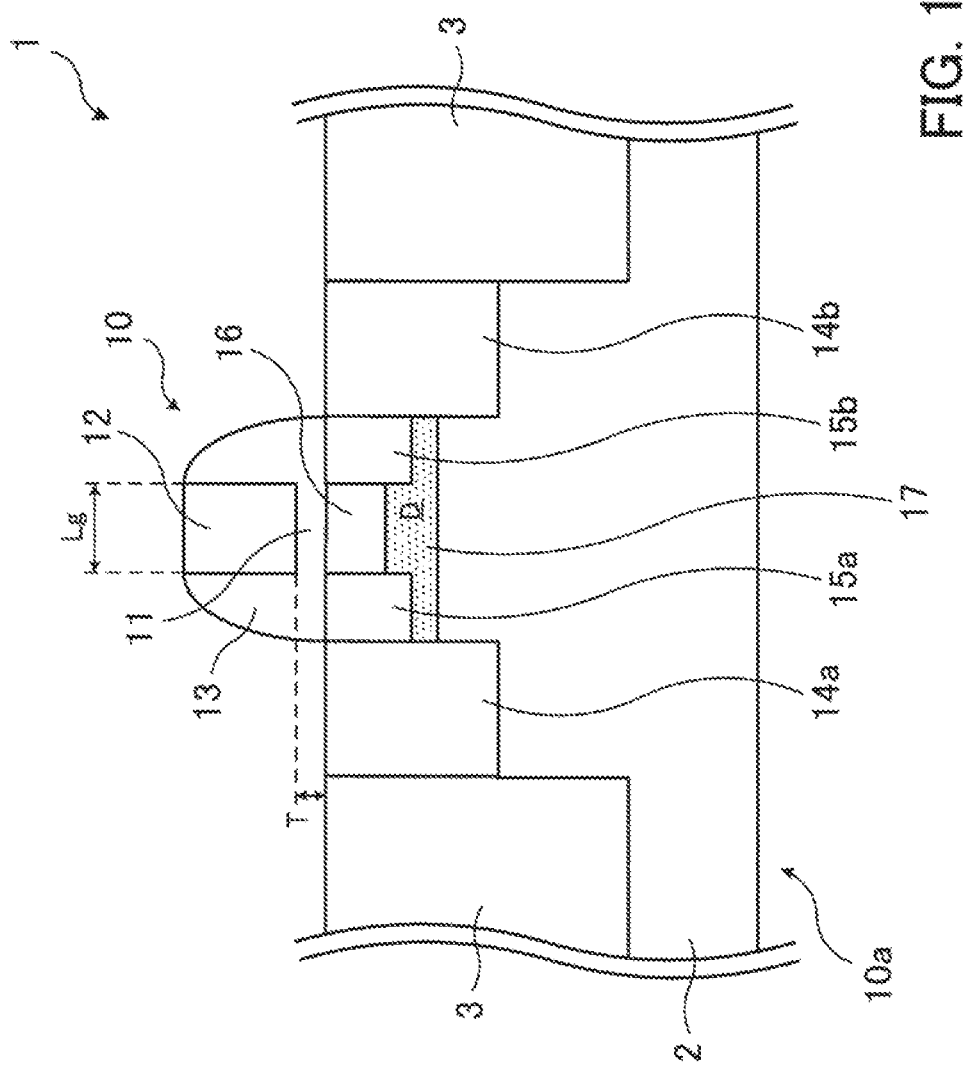
FIG. 1 illustrates a configuration example of a semiconductor device according to an embodiment.

Several embodiments will be described below with reference to the accompanying drawings, wherein like reference numerals refer to like elements throughout.

First, there will be explained a transistor according to an embodiment and the off current thereof.

FIG. 1 illustrates a configuration example of a semiconductor device according to an embodiment. FIG. 1 schematically illustrates a cross section of a relevant part in an example of the semiconductor device according to the embodiment.

A semiconductor device 1 illustrated in FIG. 1 includes a transistor 10. The transistor 10 is formed on a semiconductor substrate 2 of a p-type or an n-type. Various kinds of semiconductor substrate of silicon (Si), silicon germanium (SiGe) and the like are used as the semiconductor substrate 2. A region (element region) 10a where the transistor 10 is formed is defined by an element isolation region 3 formed on the semiconductor substrate 2 by the use of an STI method or the like.

Note that, while FIG. 1 illustrates one transistor 10, the semiconductor device 1 may include a plurality of transistors 10 or at least one transistor 10 and other transistors.

As illustrated in FIG. 1, the transistor 10 includes a gate insulating film 11 provided over the semiconductor substrate 2, a gate electrode 12 provided over the gate insulating film 11, and side wall insulating films 13 provided over the side wall of the gate electrode 12 and the semiconductor substrate 2. The transistor 10 further includes an impurity region 14a and an impurity region 14b which are respectively provided in the semiconductor substrate 2 on both sides of the gate electrode 12 (both sides in a gate length direction), and function as a source region or a drain region. The transistor 10 may include an LDD region 15a and an LDD region 15b on the inner sides of the impurity region 14a and the impurity region 14b in the semiconductor substrate 2 under the side wall insulating films 13. The transistor 10 further includes a channel region 16 provided in a region between the impurity region 14a and the impurity region 14b (or between the LDD region 15a and the LDD region 15b) under the gate electrode 12, and an impurity region 17 provided under the channel region 16.

Here, it is possible to use various kinds of insulating material such as silicon oxide for the gate insulating film 11. It is possible to use various kinds of conductor material such as poly-silicon for the gate electrode 12. Further, it is possible to use an oxide film such as a silicon oxide film and a nitride film such as a silicon nitride film for the side wall Insulating film 13.

Each of the impurity region 14a and the impurity region 14b contains impurities of an n-type or p-type conductivity type (impurities of a conductivity type different from that of the semiconductor substrate 2) in a predetermined concentration. Each of the LDD region 15a and the LDD region 15b contains impurities of the same conductivity type as that of the impurities contained in the impurity region 14a and the impurity region 14b in concentrations lower than those of the impurity region 14a and the impurity region 14b.

The channel region 16 is a non-doped region which is not doped with impurities intentionally, or a region containing impurities in a very low concentration. The impurity concentration of the channel region 16 is made not higher than $1 \times 10^{17}$ cm$^{-3}$, for example.

The impurity region 17 is provided under the channel region 16, and is a region containing impurities in a higher concentration than the channel region 16. The impurity region 17 is also called a screen layer. The impurity region 17 contains impurities of a conductivity-type different from that of the impurities contained in the impurity region 14a and the impurity region 14b which function as the source region or the drain region, in a predetermined concentration. The threshold voltage of the transistor 10 is controlled by the impurity concentration of this impurity region 17. Further, the impurity region 17 prevents punch through between the impurity region 14a and the impurity region 14b which function as the source region or the drain region. The impurity region 17 is provided at a position embedded inside the semiconductor substrate 2 in an amount corresponding to the thickness of the channel region 16 from the interface between the semiconductor substrate 2 and the gate insulating film 11, and, since the threshold voltage is adjusted by the impurity concentration thereof, the impurity region 17 is made to have a comparatively high impurity concentration of approximately $1 \times 10^{19}$ cm$^{-3}$, for example.

The impurity region 17 is provided so as to contact the impurity region 14a and the impurity region 14b which function as the source region or the drain region, for effectively realizing functions of the control of the threshold voltage, the prevention of the punch through, and the like. Preferably, the impurity region 17 is located at a shallower position than the impurity region 14a and the impurity region 14b (the lower end of the impurity region 17 is located higher than the lower ends of the impurity region 14a and the impurity region 14b).

There will be described the off current Ioff in the transistor 10 having the configuration as illustrated in FIG. 1.

Generally, the off current Ioff of a MOS field effect transistor (MOSFET) includes the sum of the sub-threshold leak current Isoff and the junction leak current Iboff.

Further, for the MOSFET, there is a technique of increasing the absolute value of the threshold voltage Vth and reducing the sub-threshold leak current Isoff by applying a positive or negative voltage (body bias or substrate bias) Vbb to the semiconductor substrate depending on the channel, type of the MOSFET. For example, the threshold voltage Vth increases monotonically as the body bias Vbb increases. Here, the change amount (increase amount) of the threshold voltage Vth with respect to the change amount (increase amount) of the body bias Vbb is called a "Vbb coefficient".

Further, here, for discriminating the transistor 10 from a typical transistor, a typical channel region which is provided in the surface layer part of the semiconductor substrate under the gate electrode and does not have a very low concentration is called a "flat channel region", and a transistor provided with the flat channel region is called a "flat channel transistor".

in the above transistor 10, since the Vbb coefficient is large compared with the flat channel transistor and the reduction of the sub-threshold leak current Isoff is large when the body bias Vbb is applied to the semiconductor substrate 2, a more preferable result is obtained when the body bias Vbb is applied.

Figure 2:
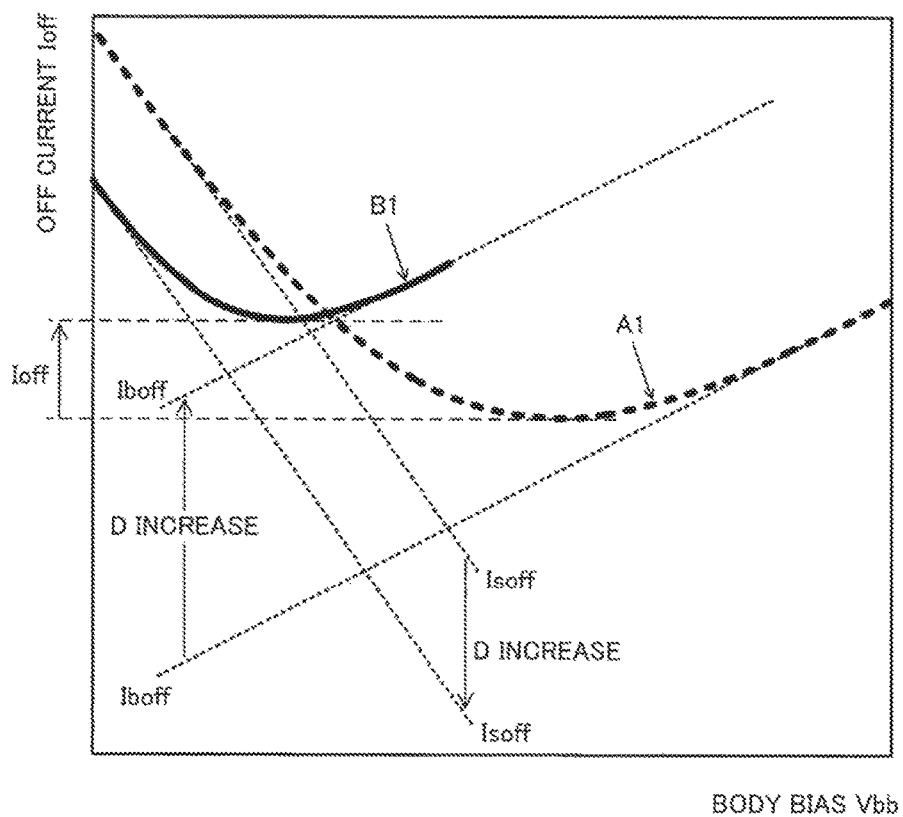
FIG. 2 to FIG. 4 illustrate examples of relationships between body bias Vbb and off current Ioff.

Here, FIG. 2 illustrates an example of a relationship between the body bias Vbb and the off current Ioff in the transistor 10. The horizontal axis of FIG. 2 expresses the body bias Vbb and the vertical axis of FIG. 2 expresses the off current Ioff.

The sub-threshold leak current Iboff decreases as the threshold voltage Vth increases. On the other side, the junction leak current Iboff increases as the threshold voltage Vth increases. Since the threshold voltage Vth increases monotonically as the body bias Vbb increases, the relationship between the body bias Vbb and the off current Ioff (=Isoff+Iboff) is expressed by a graph having a minimum value as illustrated in FIG. 2 by curve A1 (dotted line), for example. The minimum value of this graph indicates the minimum off current Ioff of the transistor 10 having a characteristic expressed by curve A1.

Now, there is considered a case where the impurity concentration (dose amount) D of the impurity region 17 is increased in the transistor 10 having the characteristic expressed by curve A1. When the dose amount D is increased in the impurity region 17 as described, while the sub-threshold leak current Isoff decreases, the junction leak current Iboff increases significantly. Accordingly, the relationship between the body bias Vbb and the off current Ioff when the dose amount D of the impurity region 17 is increased is expressed by a graph as illustrated in FIG. 2 by curve B1 (solid line), for example. The minimum off current Ioff which is a minimum value of this curve B1 is increased compared with the case that the dose amount D of the impurity region 17 is not increased (off current Ioff of curve A1).

As described above, in the transistor 10 in which, under the low concentration channel region 16, there is provided the impurity region 17 having a higher concentration than the channel region 16, there may arise a problem in which, when the dose amount D of the impurity region 17 is increased, the off current Ioff increases.

Figure 3:
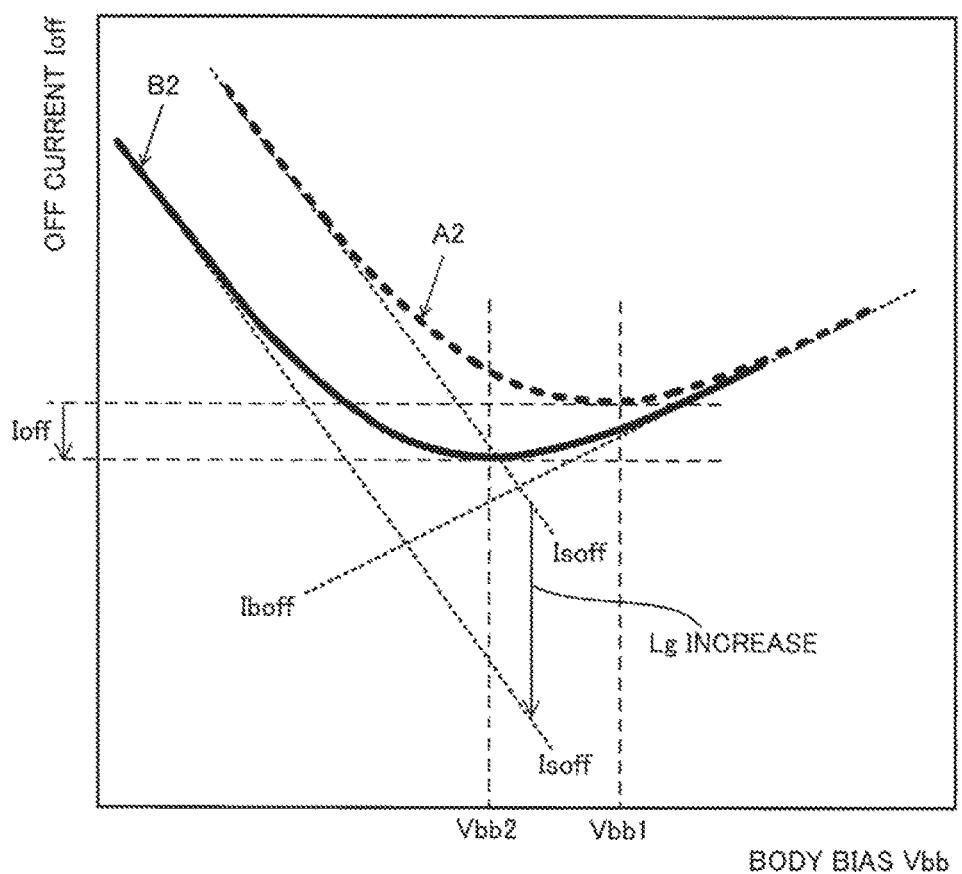

FIG. 3 illustrates another example of the relationship between the body bias Vbb and the off current Ioff in the transistor 10. The horizontal axis of FIG. 3 expresses the body bias Vbb and the vertical axis of FIG. 3 expresses the off current Ioff.

In the transistor 10, it is possible to reduce the sub-threshold leak current Isoff by increasing the gate length Lg (or effective gate length) of the gate electrode 12 without changing the concentration of the impurity region 17. However, the junction leak current Iboff does not depend on the gate length Lg of the gate electrode 12. Accordingly, the relationship between the body bias Vbb and the off current Ioff when the gate length Lg of the gate electrode 12 is increased in the transistor 10 having the characteristic expressed by curve A2 (dotted line) in FIG. 3 is expressed by a graph as illustrated by curve B2 (solid line) in FIG. 3, for example. The minimum off current Ioff which is a minimum value of this curve B2 decreases compared with the case that the gate length Lg of the gate electrode 12 is not increased (off current Ioff of curve A2).

In this manner, a certain reduction effect of the off current Ioff is obtained by the increase of the gate length Lg in the gate electrode 12. Moreover, also body bias Vbb at which the minimum off current Ioff is obtained decreases from Vbb1 to Vbb2 as illustrated in FIG. 3. However, there is a limit for the increase of the gate length Lg in the gate electrode 12, and providing the gate electrode 12 having a large gate length Lg increases the occupation area of the transistor 10 on the semiconductor substrate 2. Such an increase in the occupation area of the transistor 10 causes an area increase in a circuit including other electronic elements formed (mounted) together with the transistor 10 on the semiconductor substrate 2, a resultant manufacturing cost increase of the semiconductor device 1, and a power consumption increase caused by load capacitance increase.

As a method of reducing the junction leak current Iboff, it is proposed to moderate (make graded) the profile of the impurity concentration in the LDD region 15a and the LDD region 15b provided on both sides of the channel region 16.

However, in the transistor 10 in which, under the channel region 16 which has a low concentration as described above, there is provided the impurity region 17 having a higher concentration than the channel region 16, the effect of the impurity concentration profiles of the LDD region 15a and the LDD region 15b to the junction leak current Iboff is not large.

Further, in a sub-threshold circuit or the like operated at a voltage lower than the threshold voltage Vth (sub-threshold region), the power supply voltage Vdd is very low, such as 0.5 V, for example. Accordingly, it is difficult to obtain a sufficient reduction effect of the junction leak current Iboff by the graded profiles of the impurity concentration in the LDD region 15a and the LDD region 15b.

Moreover, when the impurity concentration profiles are made graded in the LDD region 15a and the LDD region 15b, a short channel effect becomes prominent. Accordingly, the minimum gate length Lg for suppressing the short channel effect becomes large, which may cause the area increase in the transistor 10 and the area increase of a circuit including the transistor 10.

Figure 4:
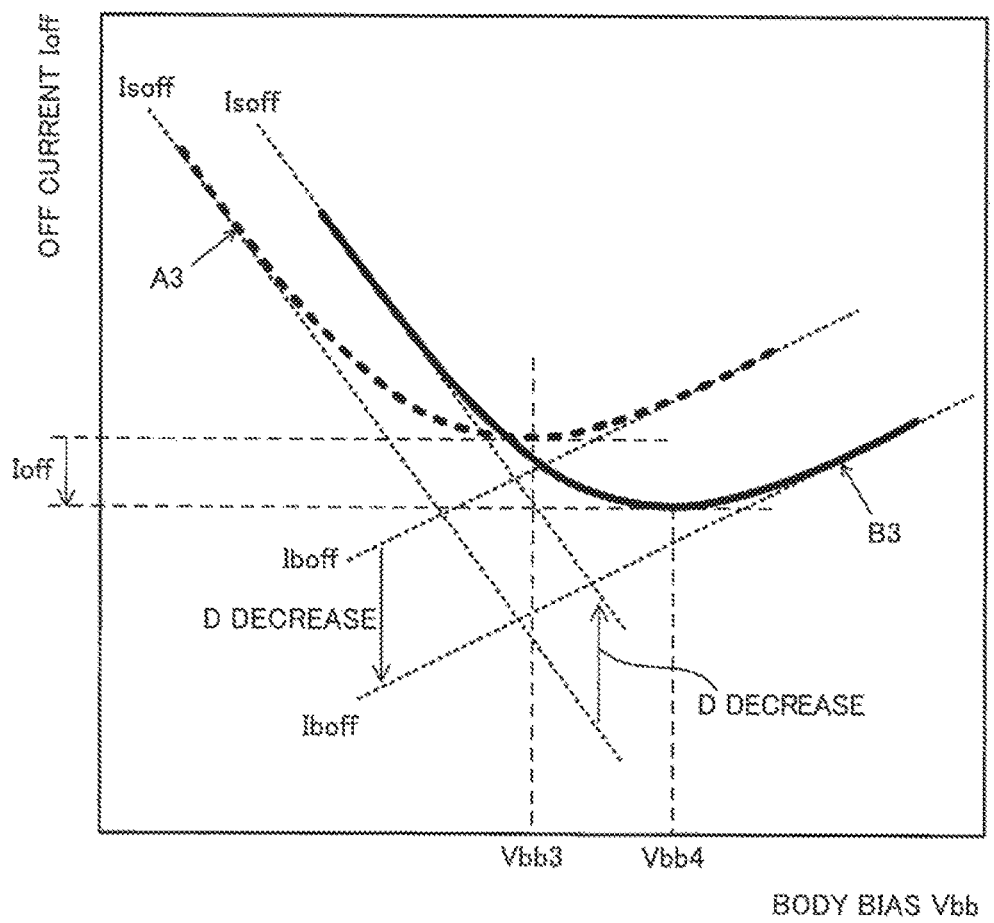

FIG. 4 illustrates another example of the relationship between the body bias Vbb and the off current Ioff in the transistor 10. The horizontal axis of FIG. 4 expresses the body bias Vbb and the vertical axis of FIG. 4 expresses the off current Ioff.

For reducing the junction leak current Iboff of the transistor 10 in consideration of low voltage operation, it is effective to reduce the dose amount D of the impurity region 17.

When the dose amount D of the impurity region 17 is reduced in the transistor 10 having the characteristic expressed by curve A3 (dotted line) in FIG. 4, the junction leak current Iboff decreases as expressed by curve B3 (solid line) of FIG. 4. On the other side, however, when the dose amount D of the impurity region 17 is reduced, the sub-threshold leak current Isoff increases as expressed by curve B3 of FIG. 4. When the dose amount D of the impurity region 17 is reduced, although a certain reduction effect of the off current Ioff is obtained, sometimes a sufficiently low off current Ioff is not obtained preferably for the semiconductor device 1.

Moreover, it is assumed that the transistor 10 having the characteristic expressed by curve A3 and the transistor 10 having the characteristic expressed by curve B3 in FIG. 4 are mixedly mounted on the common semiconductor substrate 2. For example, this is a case where the transistor 10 having the characteristic expressed by curve A3 and the transistor 10 having the characteristic expressed by curve B3 are mixedly mounted on the common semiconductor substrate 2 as a low leak transistor having a low off current Ioff and a very low leak transistor having a further lower off current Ioff, respectively.

In such a case, the body bias Vbb at which the minimum off current Ioff is obtained for the transistor 10 having the characteristic expressed by curve A3 has a value of Vbb3 illustrated in FIG. 4. The body bias Vbb at which the minimum off current Ioff is obtained for the transistor 10 having the characteristic expressed by curve B3 has a value of Vbb4 illustrated in FIG. 4. In this manner, the optimum body biases Vbb at which the minimum off currents Ioff are obtained in a group of both transistors 10 have such different values as Vbb3 and Vbb4.

Accordingly, two kinds of circuit (Vbb generation circuits) to generate the different body biases Vbb3 and Vbb4 need to be prepared for applying the respective optimum body biases Vbb to the group of both transistors 10. The case of mixedly mounting also the two kinds of Vbb generation circuit to apply the respective optimum body biases Vbb3 and Vbb4 together with the group of the two kinds of transistor 10 having the different optimum body biases Vbb on the semiconductor substrate 2 may invite the increase of a circuit area and the increase in a size of a semiconductor device. Moreover, there is a possibility that providing the two kinds of Vbb generation circuit increases the power consumption of the semiconductor device.

Note that, when the gate length Lg is increased as described for above FIG. 3 for suppressing such an increase of the power consumption, the reduction of the off current Ioff and the optimum body bias Vbb may be obtained. However, as described above, this might cause the increase of the circuit area because of the increased gate length Lg.

Accordingly, in view of the above, for the transistor 10 provided with the impurity region 17 having a higher concentration than the channel region 16 having a low concentration as above under the channel region 16, a configuration to be explained in the following as a first embodiment is adopted to achieve the reduction of the off current Ioff of the transistor 10 and the like.

Figure 5:
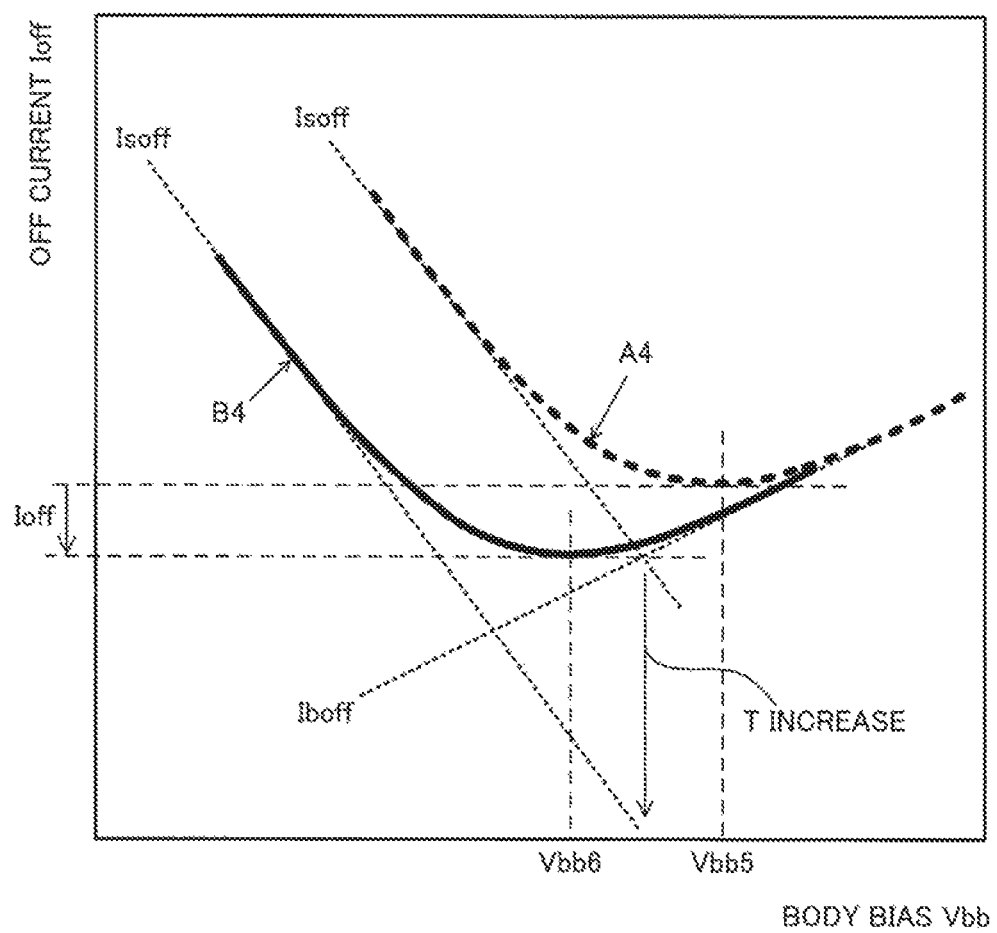
FIG. 5 illustrates a first example of a relationship between body bias Vbb and off current Ioff in a transistor according to a first embodiment.

FIG. 5 illustrates a first example of the relationship between the body bias Vbb and the oft current Ioff in a transistor according to the first embodiment. The horizontal axis of FIG. 5 expresses the body bias Vbb and the vertical axis of FIG. 5 expresses the off current Ioff.

In the first embodiment, the thickness T of the gate insulating film 11 is increased in the transistor 10 having a configuration as illustrated in above FIG. 1. The relationship between the body bias Vbb and the off current Ioff when the thickness T of the gate insulating film 11 is increased in the transistor 10 having the characteristic expressed by curve M (dotted line) of FIG. 5 is expressed by a graph as illustrated by curve B4 (solid line) in FIG. 5, for example. The minimum off current Ioff which is the minimum value of curve 84 is reduced compared with the case that the thickness T of the gate insulating film 11 is not increased (off current Ioff in curve A4).

In the transistor 10 in which, under the channel region 16 having a low concentration, there is provided the impurity region 17 having a higher concentration than the channel region 16, when the thickness T of the gate insulating film 11 is increased, the threshold voltage Vth increases and the sub-threshold leak current Isoff decreases. Moreover, in the transistor 10, when the thickness T of the gate insulating film 11 is increased, the Vbb coefficient which is originally comparatively large is increased, and the reduction effect of the sub-threshold leak current Isoff when the body bias Vbb is applied becomes large compared with the case that the thickness T is not increased. On the other side, the junction leak current Iboff does not depend on the thickness T of the gate insulating film 11 or decreases slightly by the increase of the thickness T. As a result, in the transistor 10 in which the thickness T of the gate insulating film 11 is increased, the minimum off current Ioff decreases effectively.

Moreover, in the transistor 10 in which the thickness T of the gate insulating film 11 is increased, it is possible to reduce also the body bias Vbb at which the minimum off current Ioff of the transistor 10 is obtained from Vbb5 to Vbb6 as illustrated in FIG. 5 and it is possible to achieve the reduction in power consumption of the Vbb generation circuit.

Meanwhile, in the fiat channel transistor, the variation of the threshold voltage Vth (Random Dopant Fluctuation: RDF) increases as the thickness T of the gate insulating film is increased. On the other side, although, also in the transistor 10, the variation of the threshold voltage Vth tends to increase as the thickness T of the gate insulating film 11 is increased, the increase trend (increase rate) is very moderate compared with that of the flat channel transistor.

Figure 6:
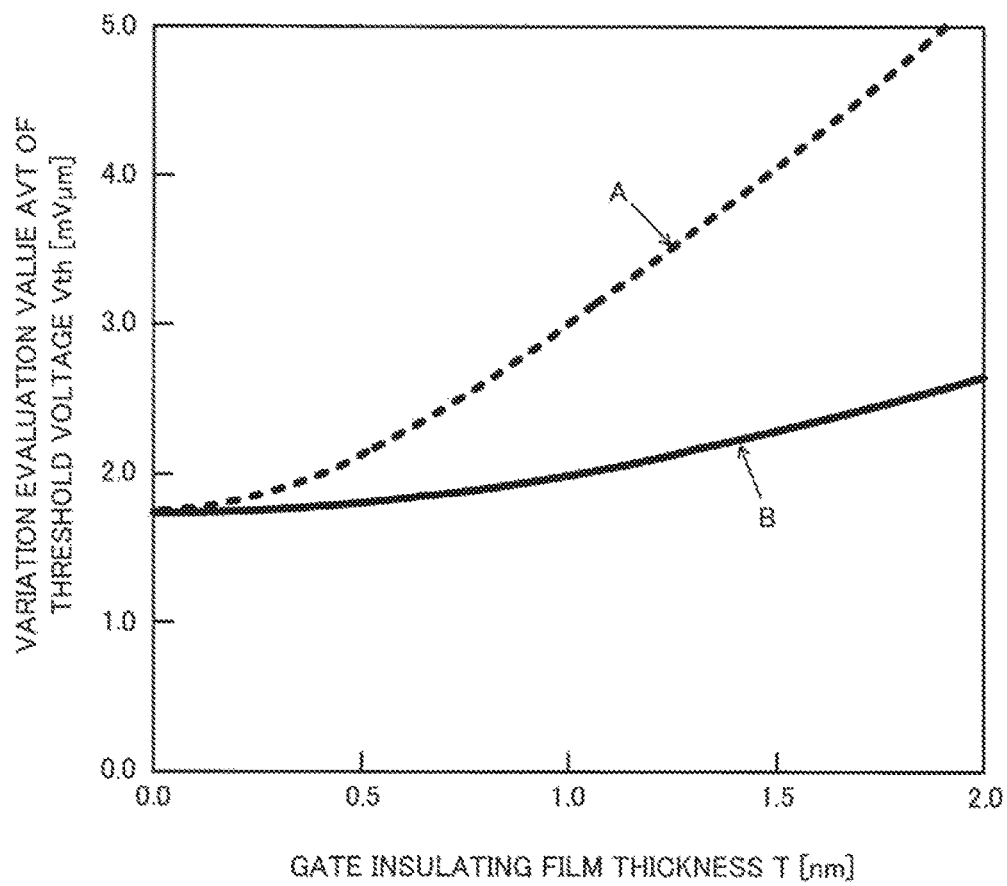
FIG. 6 illustrates an example of a relationship between a thickness T of a gate insulating film and a variation evaluation value AVT of a threshold voltage Vth.

FIG. 6 illustrates an example of the relationship between the thickness T of the gate insulating film and the variation evaluation value AVT of the threshold voltage Vth.

The horizontal axis of FIG. 6 expresses the thickness T (nm) of the gate insulating film. The vertical axis of FIG. 6 expresses the gradient AVT (mVμm) of a Pelgrom plot (plot of the standard deviation σ (Vth) (mV) of the threshold voltage Vth with respect to the reciprocal (μm$^{-1}$) of the square root of a gate area (channel length L×channel width W)) as a variation evaluation value of the threshold voltage Vth.

FIG. 6 illustrates an example of the relationship between the thickness T of a gate insulating film and the variation evaluation value AVT of the threshold voltage Vth in a flat channel transistor by dotted line A. FIG. 6 illustrates an example of the relationship between the thickness T of the gate insulating film 11 and the variation evaluation value AVT of the threshold voltage Vth in the above transistor 10 by solid line B.

As illustrated in FIG. 6 by dotted line A, in the flat, channel transistor, the variation evaluation value AVT of the threshold voltage Vth increases as the thickness T of the gate insulating film is increased.

For securely operating a transistor group having variation among the threshold voltages Vth at the same power supply voltage Vdd, it is needed to balance the operation speed of a transistor having the highest threshold voltage Vth and the operation speed of a transistor having the lowest threshold voltage Vth, but it is difficult to reduce the power supply voltage Vdd when the variation of the threshold voltage Vth is large. Since the power consumption is proportional to the square of the power supply voltage, the power supply voltage Vdd needs to be reduced for reducing the power consumption, and the variation of the threshold voltage Vth needs to be suppressed for reducing the power supply voltage Vdd.

In the flat channel transistor, however, as described above, the variation of the threshold voltage Vth increases as the thickness T of the gate insulating film is increased (dotted line A in FIG. 6). Accordingly, when the gate insulating film is made thicker, the variation of the threshold voltage Vth increases, and, in the worst case, the power supply voltage Vdd has to be increased for stable operation and thereby the increase of the power consumption might be invited. For realizing the reduction of the power supply voltage Vdd and the reduction of the power consumption in the flat channel transistor, the gate insulating film needs to be made thinner, and therefore it is difficult to realize them by increasing the thickness of the gate insulating film.

On the other side, as illustrated in FIG. 6 by solid line B, in the transistor 10, even when the thickness T of the gate insulating film 11 is increased, the increase rate of the variation evaluation value AVT of the threshold voltage Vth is small compared with the flat channel transistor and the increase in the variation of the threshold voltage Vth is suppressed. Therefore, even when a group of the transistors 10 is operated at the same power supply voltage Vdd, for example, it is possible to prevent the power supply voltage Vdd from being set to a high value and to suppress the increase of the power consumption in the semiconductor device 1 including the group of the transistors 10.

As illustrated in above FIG. 5, in the transistor 10, it is possible to reduce the off current Ioff by the increase of the thickness T of the gate insulating film 11, and also to reduce the value of the body bias Vbb at which the minimum off current Ioff is obtained. Then, in the transistor 10, even when the thickness T of the gate insulating film 11 is increased for realizing the reduction of the off current Ioff and the like, as illustrated in FIG. 6, increase of the variation of the threshold voltage Vth is suppressed, and thereby it is possible to suppress the increase of the power supply voltage Vdd and the increase of the power consumption.

In the flat channel transistor, the variation of the threshold voltage Vth increases significantly compared with the transistor 10 when the thickness T of the gate insulating film is increased. Accordingly, it is difficult to operate the flat channel transistor at a low power supply voltage Vdd such as 1.0 V or lower, for example, and to achieve the reduction of the power consumption by enabling operation at a low power supply voltage Vdd. On the other side, even when the thickness T is increased, it is possible to operate the transistor 10 at such a low power supply voltage Vdd as 1.0 V or lower, for example, and to achieve the reduction of the power consumption by enabling operation at a low power supply voltage Vdd.

For reducing the off current Ioff in the transistor 10, the dose amount D of the impurity region 17 may be reduced together with the increase of the thickness T of the gate insulating film 11.

Figure 7:
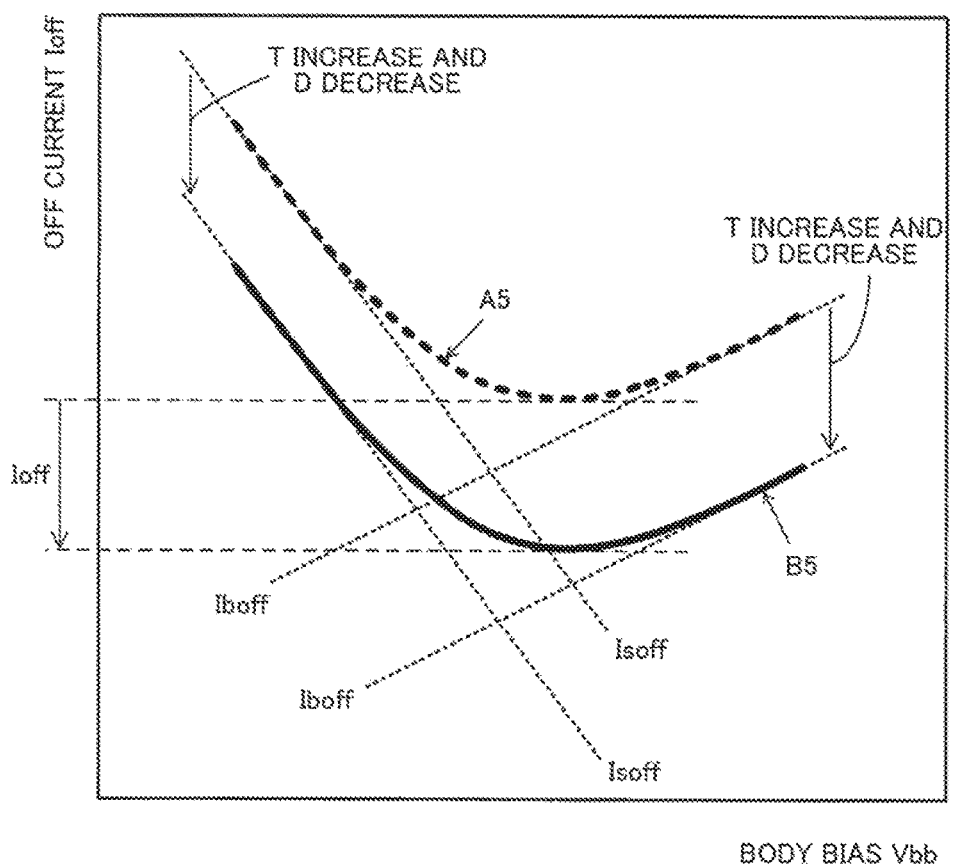
FIG. 7 illustrates a second example of a relationship between body bias Vbb and off current Ioff in a transistor according to the first embodiment.

FIG. 7 illustrates a second example of the relationship between the body bias Vbb and the off current Ioff in the transistor according to the first embodiment. The horizontal axis of FIG. 7 expresses the body bias Vbb, and the vertical axis of FIG. 7 expresses the off current Ioff.

As described for above FIG. 5, in the transistor 10, when the thickness T of the gate insulating film 11 is increased, while the junction leak current Iboff does not change or decreases slightly, the sub-threshold leak current Isoff decreases effectively (curve A4 to curve B4). Thereby, the off current Ioff deceases in the transistor 10.

Here, in addition to the increase of the thickness T of the gate insulating film 11 in this manner, the dose amount D is reduced in the impurity region 17 provided under the channel region 16. When the dose amount D is reduced in the impurity region 17, as described for above FIG. 4, while the junction leak current Iboff decreases effectively, the sub-threshold leak current Isoff increases (curve A3 to curve B3).

When the method of increasing the thickness T of the gate insulating film 11 and the method of reducing the dose amount D in the impurity region 17 are combined to be adopted for the transistor 10 having the characteristic expressed by curve A5 (dotted line) in FIG. 7, a graph as illustrated by curve 35 (solid line) in FIG. 7 is obtained, for example. Adopting the method of increasing the thickness T of the gate insulating film 11 in combination with the method of reducing the dose amount D in the impurity region 17 reduces effectively each of the sub-threshold leak current Isoff and the junction leak current Iboff.

That is, while the reduction amount becomes smaller than that obtained only by the method of increasing the thickness T, it is possible to reduce the sub-threshold leak current Isoff of the transistor 10 as a whole by the effective reduction effect of the sub-threshold leak current Isoff by the increased thickness T. Further, it is possible to reduce the junction leak current Iboff in the transistor 10 by the effective reduction effect of the junction leak current Iboff by the reduced dose amount D in the impurity region 17.

In this manner, the off current Ioff of the transistor 10 may be reduced by adoption of the method of increasing the thickness T of the gate insulating film 11 in combination with the method of reducing the dose amount D in the impurity region 17.

When the method of reducing the dose amount D in the impurity region 17 is combined in this manner, the body bias Vbb at which the minimum off current Ioff is obtained may change from that in the case of using only the method of increasing the thickness T of the gate insulating film 11 (curve B4 in FIG. 5). This is because the junction leak current Iboff 13 also reduced by the reduction of the dose amount D in the impurity region 17 in addition to the reduction of the sub-threshold leak current Isoff by the increase of the thickness T.

Figure 8:
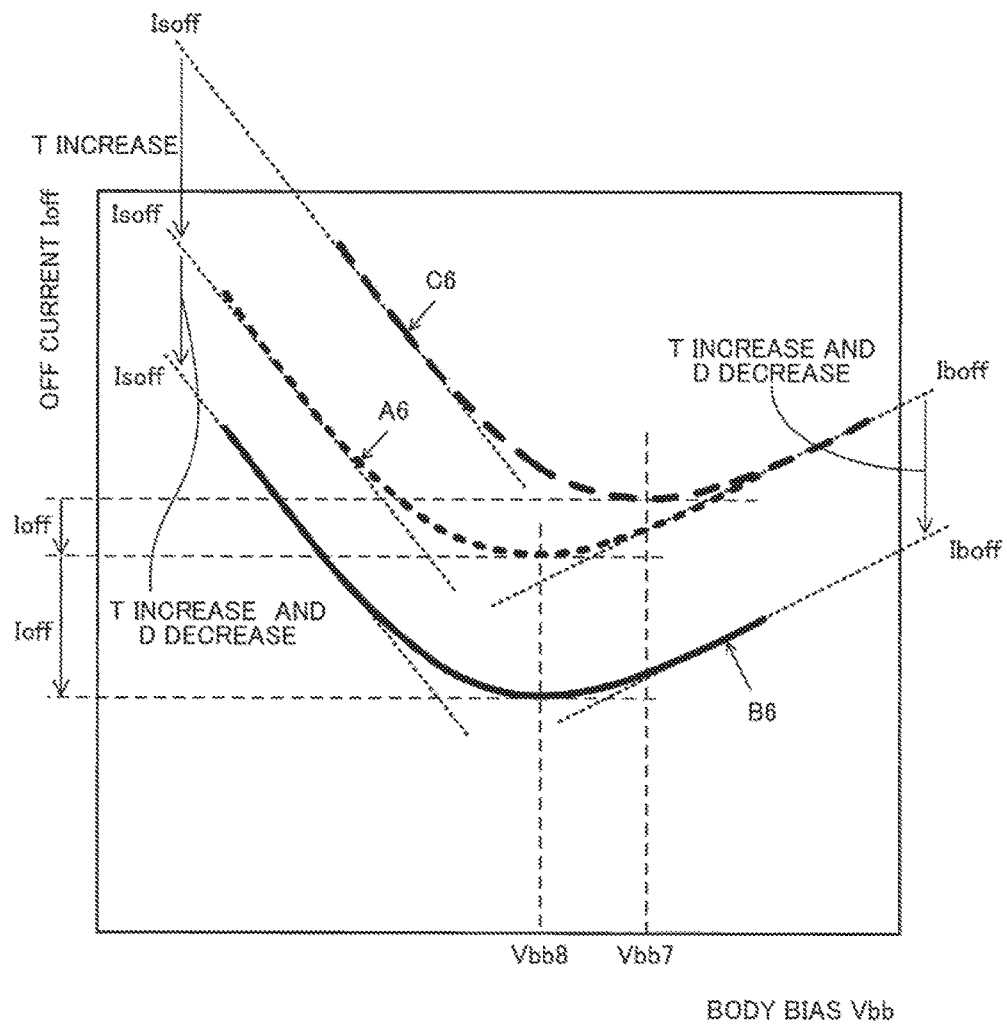
FIG. 8 illustrates a third example of a relationship between body bias Vbb and off current Ioff in a transistor according to the first embodiment.

Here, FIG. 8 illustrates a third example of the relationship between the body bias Vbb and the off current Ioff in the transistor according to the first embodiment. The horizontal axis of FIG. 8 expresses the body bias Vbb, and the vertical axis of FIG. 8 expresses the off current Ioff.

Now, it is assumed that the transistor 10 having the characteristic expressed by curve A6 (dotted line) in FIG. 8 and the transistor 10 having the characteristic expressed by curve B6 (solid line) are mixedly mounted on the common semiconductor substrate 2. For example, this is the case where the transistor 10 having the characteristic expressed by curve A6 and the transistor 10 having the characteristic expressed by curve B6 are mixedly mounted on the common semiconductor substrate 2 as a low leak transistor having a low off current Ioff and a very low leak transistor having a further lower off current Ioff, respectively.

In this case, the transistor 10 having the characteristic expressed by curve A6 is obtained from the transistor 10 having the characteristic expressed by curve C6 (chain line) in FIG. 8, for example, by the increase of the thickness T of the gate insulating film 11, and used as the low leak transistor. Thereby, it is possible to realize the low leak transistor in which the off current Ioff is reduced and the value of the optimum body bias Vbb at which the minimum off current Ioff is obtained is reduced from Vbb7 to Vbb8.

Moreover, the transistor 10 having the characteristic expressed by curve B6 is obtained from the transistor 10 having the characteristic expressed by curve A6 in FIG. 8, by the increase in the thickness T of the gate insulating film 11 and also by the reduction in the dose amount D of the impurity region 17, and used as the very low leak transistor. In this case, by appropriate adjustment, of the thickness T and the dose amount D, it is possible to reduce the off current Ioff from that of the transistor 10 as the low leak transistor and also to cause the value of the body bias Vbb at which the minimum off current Ioff is obtained to coincide with that of the low leak transistor. That is, by adjusting the thickness T and the dose amount D, it is possible to cause the values of the optimum body biases Vbb to coincide with each other between the respective transistors 10 having the characteristics expressed by curve A6 and curve B6 in FIG. 8 (low leak transistor and very low leak transistor) (Vbb8 in FIG. 8).

By causing the values of the optimum body biases Vbb to coincide with each other between the transistors 10 mixedly mounted on the semiconductor substrate 2, it is possible to use the body bias Vbb applied to the semiconductor substrate 2 in common, which is advantageous in circuit configuration. For example, since it is possible to use the Vbb generation circuit to apply the body bias Vbb to a group of the transistors 10 in common, it is possible to reduce the circuit area and to reduce the size of the semiconductor device 1 compared with the case that the vbb generation circuit is provided individually. Further, when a well region to apply the body bias Vbb is provided, the well region is used also in common for the group of the transistors 10, and therefore it is possible to suppress the complexity of the manufacturing steps and a layout, compared with the case that the well region is provided individually.

Figure 9:
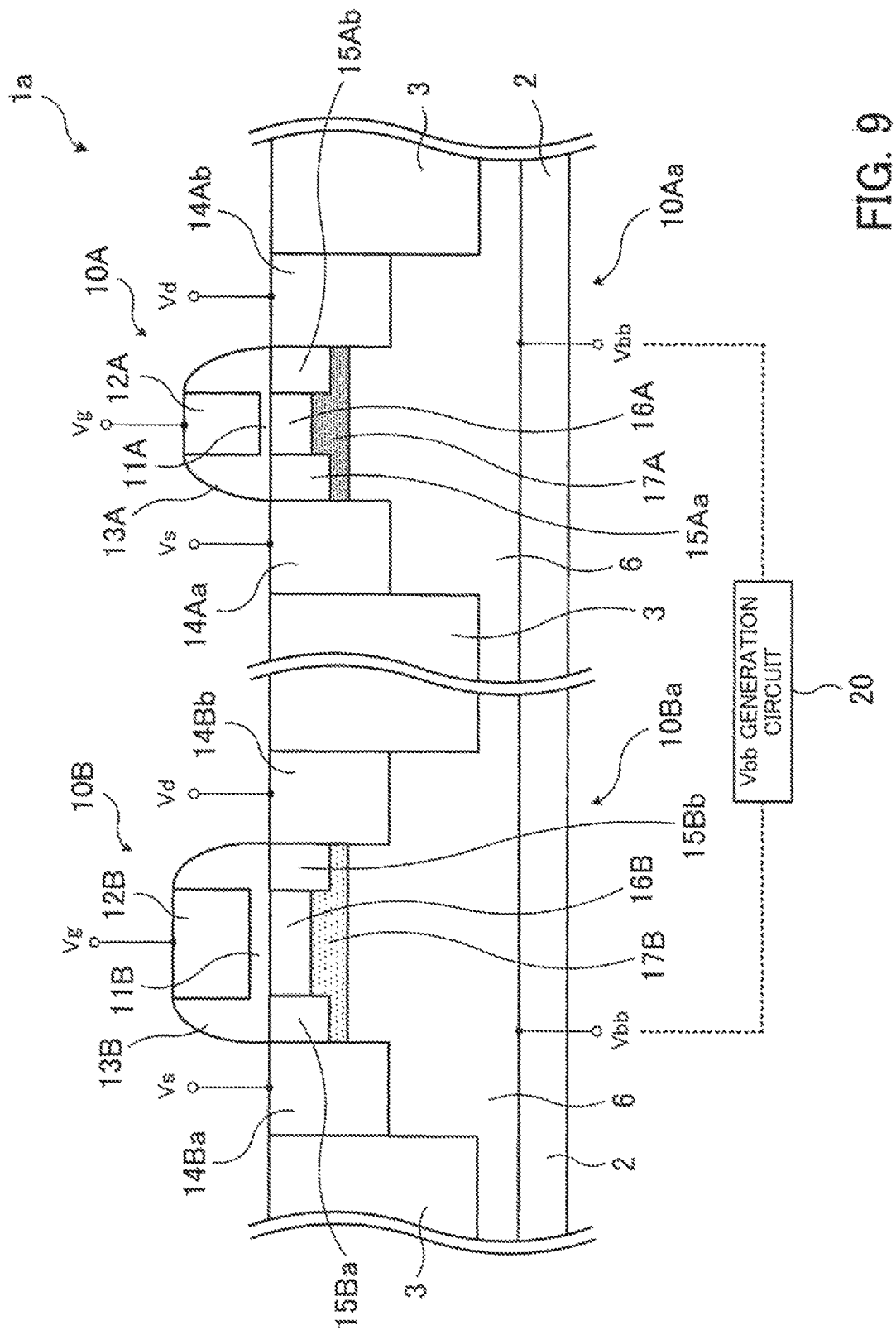
FIG. 9 illustrates a configuration example of a semiconductor device according to the first embodiment.

FIG. 9 illustrates an example of a semiconductor device having a form in which such a low leak transistor and a very low leak transistor are mixedly mounted on the semiconductor substrate 2.

FIG. 9 illustrates a configuration example of a semiconductor device according to the first embodiment. FIG. 9 schematically illustrates a cross section of a relevant part in an example of a semiconductor device according to the first embodiment.

A semiconductor device 1a illustrated in FIG. 9 includes a low leak transistor 10A and a very low leak transistor 10B formed (mixedly mounted) on the semiconductor substrate 2. An element region 10Aa and an element region 10Ba where the low leak transistor 10A and the very low leak transistor 10B are formed, respectively, are defined by an element isolation region 3. A common well region 6 of the p-type or the n-type is provided in the element region 10Aa and the element region 10Ba.

The low leak transistor 10A includes a gate insulating film 11A provided over the semiconductor substrate 2, a gate electrode 12A provided over the gate insulating film 11A, and side wail insulating films 13A provided over the side walls of the gate electrode 12A and the semiconductor substrate 2. Silicon oxide is used for the gate insulating film 11A, for example. Poly-silicon is used for the gate electrode 12A, for example. Further, silicon oxide is used for the side wall insulating films 13A, for example.

The low leak transistor 10A further includes an impurity region 14Aa and an impurity region 14Ab which are provided in the semiconductor substrate 2 respectively on both sides of the gate electrode 12A and function as a source region or a drain region. The low leak transistor 10A includes an LDD region 15Aa and an LDD region 15Ab on the inner sides of the impurity region 14Aa and the impurity region 14Ab in the semiconductor substrate 2 under the side wall insulating films 13A. Each of the impurity region 14Aa and the impurity region 14Ab contains impurities having the n-type or p-type conductivity type (impurities having a conductivity type different from that of the well region 6) in a predetermined concentration. The LDD region 15Aa and the LDD region 15Aa contain impurities having the same conductivity type as that of the impurity region 14Aa and the impurity region 14Ab in a concentration lower than those of the impurity region 14Aa and the impurity region 14Ab.

The low leak transistor 10A further includes a channel region 16A provided in a region between the impurity region 14Aa and the impurity region 14Ab (or between the LDD region 15Aa and the LDD region 15Ab) and under the gate electrode 12A, and an impurity region 17A provided under the channel region 16A. The channel region 16A is a non-doped region which is not doped with impurities intentionally, for example. The impurity region 17A is a region where imparities having a conductivity type of the p-type or the n-type (impurities having a conductivity type different from that of the impurity region 14Aa and the impurity region 14Ab) are contained in a concentration higher than that of the channel region 16A. The impurity region 17A is located in a shallower region than the impurity region 14Aa and the impurity region 14Ab, for example.

The very low leak transistor 10B includes a gate insulating film 11B provided over the semiconductor substrate 2, a gate electrode 12B provided over the gate insulating film 11B, and side wail insulating films 13B provided over the side walls of the gate electrode 12B and the semiconductor substrate 2. Silicon oxide is used for the gate insulating film 11B, for example. Poly-silicon is used for the gate electrode 12B, for example. Further, silicon oxide is used for the side wall insulating films 13B, for example.

The very low leak transistor 10B further includes an impurity region 14Ba and an impurity region 14Bb which are provided in the semiconductor substrate 2 respectively on both sides of the gate electrode 12B and function as a source region and a drain region. The very low leak transistor 10B includes an LDD region 15Ba and an LDD region 15Bb on the inner sides of the impurity region 14Ba and the impurity region 14Bb in the semiconductor substrate 2 under the side wall insulating films 13B. Each of the impurity region 14Ba and the impurity region 14Bb contains impurities having the n-type or the p-type conductivity type (impurities having a different conductivity type from that of the well region 6) in a predetermined concentration. The LDD region 15Ba and the LDD region 15Bb contain impurities having the same conductivity type as that of the impurity region 14Ba and the impurity region 14Bb in a concentration lower than those of the impurity region 14Ba and the impurity region 14Bb.

The very low leak transistor 10B further includes a channel region 16B provided in a region between the impurity region 14Bb and the impurity region 14Bb (or between the LDD region 15Ba and the LDD region 15Bb) and under the gate electrode 12B, and an impurity region 17B provided under the channel region 16B. The channel region 16B is a non-doped region which is not doped with impurities intentionally, for example. The impurity region 17B is a region where Impurities having a conductivity type of the p-type or the n-type (impurities having a conductivity type different from that of the impurity region 14Ba and the impurity region 14Bb) are contained in a concentration higher than that of the channel region 16B. The impurity region 17B is located in a shallower region than the impurity region 14Ba and the impurity region 14Bb, for example.

The gate electrode 12B of the very low leak transistor 10B is formed so as to have a larger gate length than the gate electrode 12A of the low leak transistor 10A. Thereby, a certain reduction effect of the off current Ioff is obtained (FIG. 3).

Further, the gate insulating film 11B of the very low leak transistor 10B is formed so as to have a larger thickness than the gate insulating film 11A of the low leak transistor 10A. Moreover, the impurity region 17B of the very low leak transistor 10B is formed so as to have a lower concentration than the impurity region 17A of the low leak transistor 10A. The low leak transistor 10A corresponds to a transistor having the characteristic expressed by curve A6 in above FIG. 8, and the very low leak transistor 10B corresponds to a transistor having the characteristic expressed by curve B6 in above FIG. 8.

The low leak transistor 10A and the very low leak transistor 10B having configurations as described above are connected to the same power supply voltage Vdd (operating voltage) such as 1.0 V or lower, for example. Single Vbb generation circuit 20, for example, is used for the well region 6 common between the low leak transistor 10A and the very low leak transistor 10B, and the same body bias Vbb is applied to the well region 6. When the low leak transistor 10A has the characteristic expressed by curve A6 in above FIG. 8 and the very low leak transistor 10B has the characteristic expressed by curve B6 in above FIG. 8, a body bias Vbb corresponding to Vbb8 in above FIG. 8 is applied to the well region 6. In FIG. 9, the voltage applied to the gate electrodes 12A and 12B is expressed by Vg, the voltage applied to the common well region 6 is expressed by Vbb, the voltage applied to the impurity regions 14Aa and 14Ba is expressed by Vs, and the voltage applied to the impurity regions 14Ab and 14Bb is expressed by Vd.

In the semiconductor device 1a, as described above, the gate insulating film 11B of the very low leak transistor 10B is made thicker than the gate insulating film 11A of the low leak transistor 10A. Moreover, the impurity region 17B of the very low leak transistor 10B has a lower concentration than the impurity region 17A of the low leak transistor 10A. Thereby, the off current Ioff of the low leak transistor 10A is suppressed low, and the off current Ioff of the very low leak transistor 10B is suppressed further lower, and also the body biases Vbb at which the minimum off currents Ioff are obtained are made common therebetween. According to the semiconductor device 1a, it becomes possible to realize operation at a low voltage such as 1.0 V or lower, and it becomes possible to suppress power consumption effectively by the realization of the low voltage operation like this and further by the commonalization of the body bias Vbb.

Here, the mixed mounting of the low leak transistor 10A having the characteristic expressed by curve A6 in above FIG. 8 and the very low leak transistor 10B having the characteristic expressed by curve B6 in above FIG. 8 is illustrated. The combination of the mixedly mounted transistors is not limited to this example, if one transistor has a thicker gate insulating film than the other transistor and further the impurity region provided under the channel region in one transistor is caused to have a lower concentration than the other transistor, and the off current Ioff is made different from each other to cause the optimum body biases Vbb to become common therebetween. Such a transistor combination provides the same effect as the above one.

Further, when allowed in terms of a layout (a circuit area), the gate length in each of the very low leak transistor 10B, the low leak transistor 10A, and the like mixedly mounted on the semiconductor substrate 2 may be increased. Alternatively, a transistor having an increased gate length may be mixedly mounted on the semiconductor substrate 2 with the very low leak transistor 10B, the low leak transistor 10A, and the like. The reduction of the off current Ioff is achieved by the increased gate length (FIG. 3).

The mixedly mounted transistors may include transistors in which any of the thickness of the gate insulating film, the dose amount of the impurity region provided under the channel region, and the gate length is changed and thereby the off currents Ioff are made different from each other to cause the optimum body biases Vbb to become common therebetween.

Next, a second embodiment will be explained.

Here, an application example of a transistor having a configuration as described in the above first embodiment will be explained as the second embodiment.

FIG. 10 to FIG. 31 illustrate an example of a manufacturing method for a semiconductor device according to the second embodiment. Each of FIG. 10 to FIG. 31 schematically illustrates a cross section of a relevant part in an example of each manufacturing step for the semiconductor device according to the second embodiment. In the following, each of the manufacturing steps will be explained.

Figure 10:
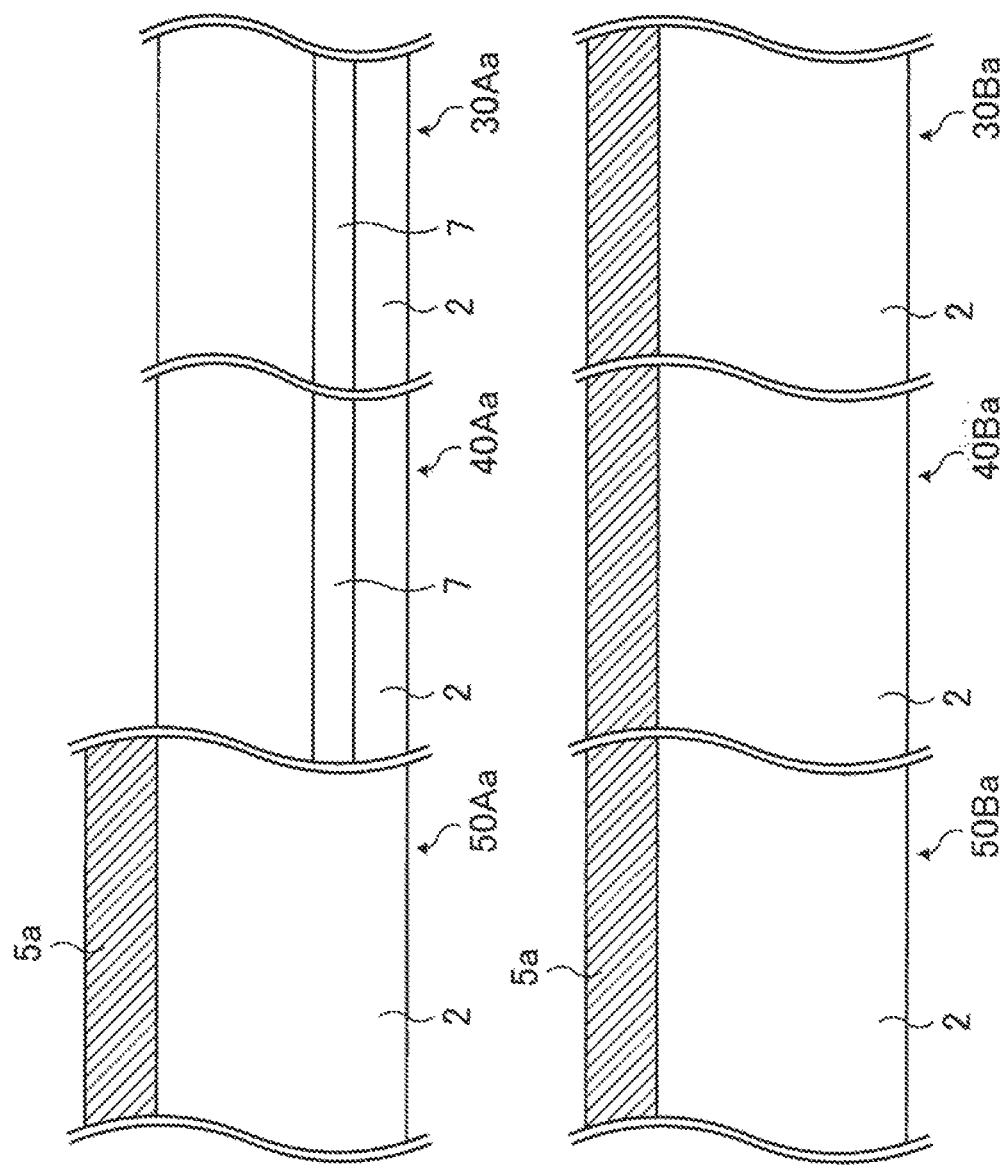
FIG. 10 illustrates an example of a first manufacturing step for a semiconductor device according to a second embodiment.

FIG. 10 illustrates an example of the first manufacturing step for the semiconductor device according to the second embodiment.

In this example, an n-channel type transistor (standard transistor) 30A (FIG. 31), an n-channel type very low leak transistor 40A (FIG. 31) having a lower off current Ioff than the standard transistor 30A, and an n-channel type I/O transistor 50A (FIG. 31) are mixedly mounted on a semiconductor substrate 2. Further, in this example, a p-channel type standard transistor 30B (FIG. 31), a P-channel type very low leak transistor 40B (FIG. 31) having a lower off current Ioff than the standard transistor 30B, and a p-channel type I/O transistor 50B (FIG. 31) are mixedly mounted on the same semiconductor substrate 2.

First, the semiconductor substrate 2 is prepared. For example, a p-type silicon substrate is prepared as the semiconductor substrate 2. A resist pattern 5a as illustrated in FIG. 10 is formed on the prepared semiconductor substrate 2. The resist pattern 5a covers an element region 50Aa for the I/O transistor 50A, an element region 50Ba for the I/O transistor 50B, an element region 40Ba for the very low leak transistor 40B, and an element region 30Ba for the standard transistor 30B. The resist pattern 5a has an opening in a region (element region for the n-channel type transistors) including an element region 40Aa for the very low leak transistor 40A and an element region 30Aa for the standard transistor 30A. By the use of the resist pattern 5a like this as a mask, n-type impurity implantation is performed, and an n-type embedded layer 7 is formed in the semiconductor substrate 2 in a region including the element region 40Aa and the element region 30Aa. The impurity implantation for forming the n-type embedded layer 7 is performed by implantation under the condition of phosphor (P) at an acceleration energy of 700 keV in a dose amount of $1.5 \times 10^{13}$ $cm^{-3}$, for example. The resist pattern 5a is removed after the impurity implantation.

Note that, before this impurity implantation (before the formation of the resist pattern 5a), an oxide film such as a silicon oxide film (not illustrated) may be formed on the semiconductor substrate 2 as a protection film thereof.

Figure 11:
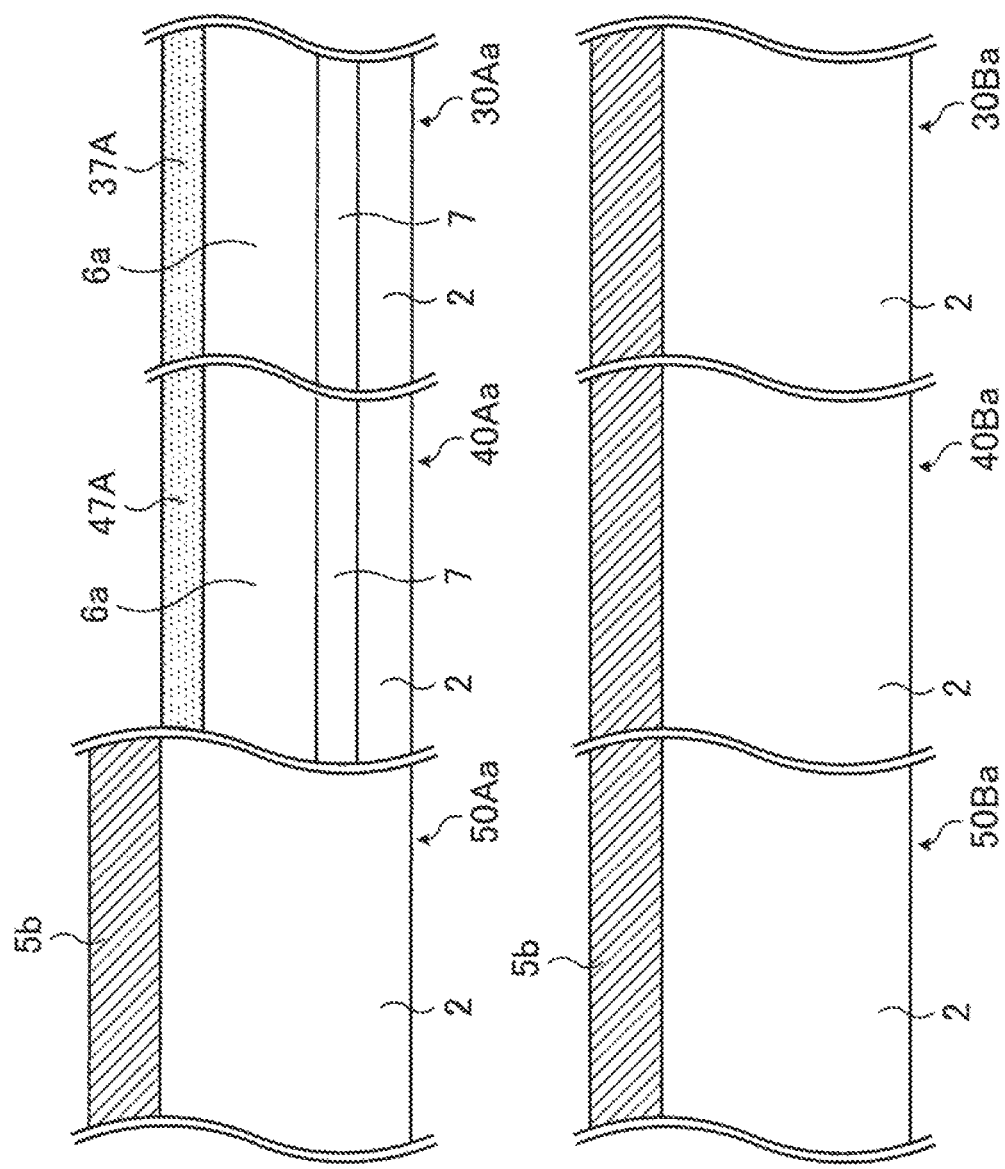
FIG. 11 illustrates an example of manufacturing step for the semiconductor device to the second embodiment.

FIG. 11 illustrates are example of the second manufacturing step of the semiconductor device according to the second embodiment.

After the formation of the n-type embedded layer 7, a resist pattern 5b is formed as illustrated in FIG. 11. The resist pattern 5b covers the element, region 50Aa, the element region 50Ba, the element region 40Ba, and the element region 30Ba, and has openings in the element region 40Aa and the element region 30Aa. By the use of this resist pattern 5b as a mask, p-type impurity implantation is performed, and a common p-type well region 6a, and a p-type impurity region 47A and a p-type impurity region 37A are formed in the semiconductor substrate 2 in the element region 40Aa and the element region 30Aa. The p-type impurity region 47A is a region having a comparatively high concentration provided under a channel region 46A (FIG. 31) in the n-channel type very low leak transistor 40A. The p-type impurity region 37A is a region having a comparatively high concentration provided under a channel region 36A (FIG. 31) in the n-channel type standard transistor 30A.

The impurity implantation for forming the p-type well region 6a, the p-type impurity region 47A, and the p-type impurity region 37A is performed under the following conditions, for example. Boron (B) is implanted under the conditions of an acceleration energy of 135 keV and a dose amount of $4 \times 10^{13}$ $cm^{-3}$. Germanium (Ge) is implanted under the conditions of an acceleration energy of 30 keV and a dose amount of $5 \times 10^{14}$ $cm^{-3}$. Carbon (C) is implanted under the conditions of an acceleration energy of 5 keV and a dose amount of $5 \times 10^{14}$ $cm^{-3}$. Boron is implanted under the conditions of an acceleration energy of 20 keV and a dose amount of $6 \times 10^{12}$ $cm^{-3}$. Boron fluoride (BF or BF2) is implanted under the conditions of an acceleration energy of 10 keV and a dose amount of $1 \times 10^{12} cm^{-3}$. By the implantation of these impurities under the respective conditions, the p-type well region 6a, the p-type impurity region 47A, and the p-type impurity region 37A are formed in the semiconductor substrate 2. Here, by the implantation of germanium and carbon, the p-type impurities contained in the p-type impurity region 47A and the p-type impurity region 37A are prevented from being diffused to the lower and upper regions. The resist pattern 5b is removed after the impurity implantation.

Figure 12:
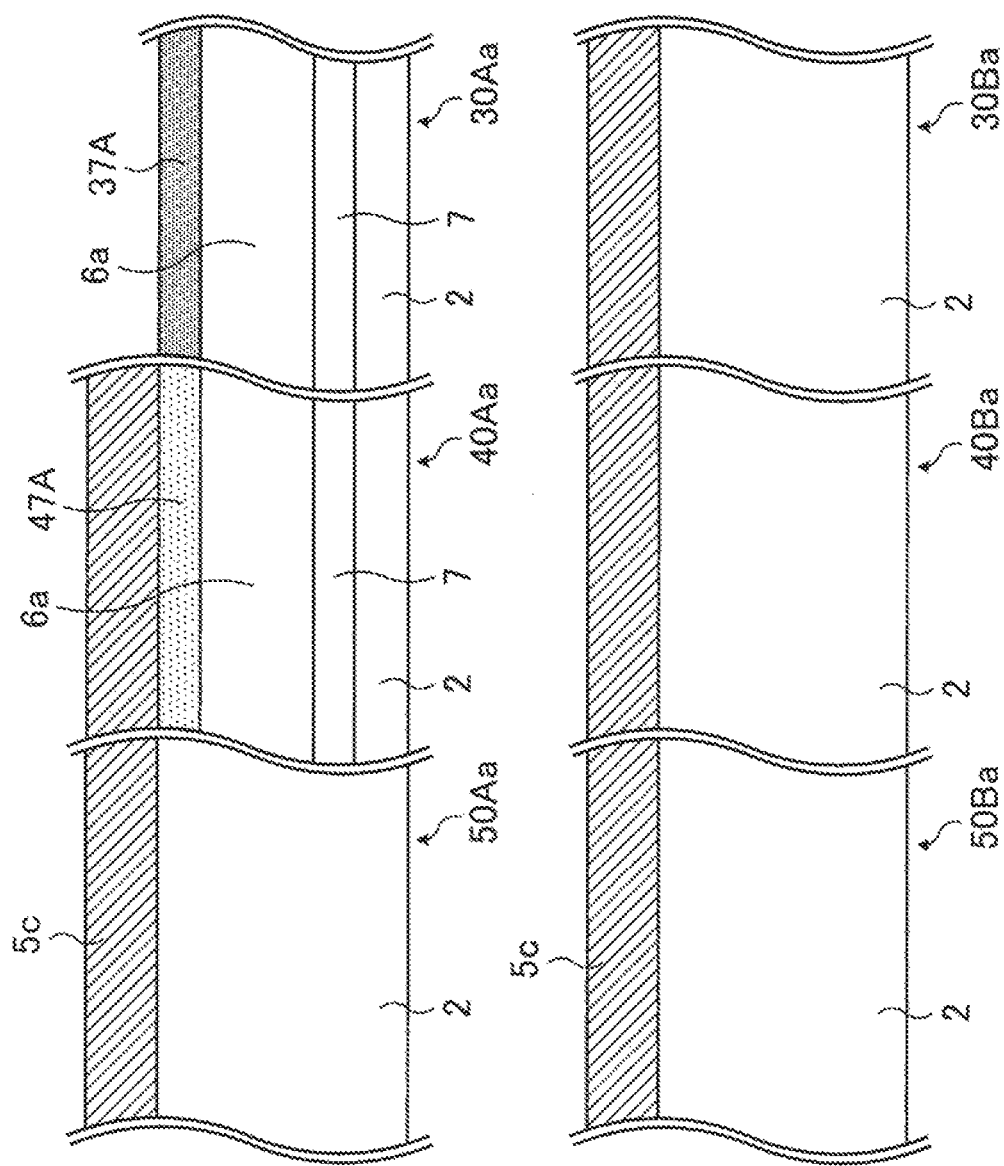
FIG. 12 illustrates an example of manufacturing step for the semiconductor device to the second embodiment.

FIG. 12 illustrates an example of the third manufacturing step of the semiconductor device according to the second embodiment.

After the formation of the p-type well region 6a, the p-type impurity region 47A, and the p-type impurity region 37A, a resist patter 5c is formed as illustrated in FIG. 12. The resist pattern 5c covers the element region 50Aa, the element region 40Aa, the element region 50Ba, the element region 40Ba and the element region 30Ba, and has an opening In the element region 30Aa. By the use of this resist pattern 5c as a mask, p-type impurity implantation is performed additionally, and the p-type impurity region 37A in the element region 30Aa is caused to have a further higher concentration. For example, the impurity implantation thereof is performed by the implantation of boron fluoride under the condition of an acceleration energy of 10 keV and a dose amount of $4 \times 10^{12}$ $cm^{-3}$. Thereby, in the element region 30Aa for the standard transistor 30A, the p-type impurity region 37A having a higher concentration than the p-type impurity region 47A in the element region 40Aa for the very low leak transistor 40A is formed. The resist pattern 5c is removed after the impurity implantation.

Figure 13:
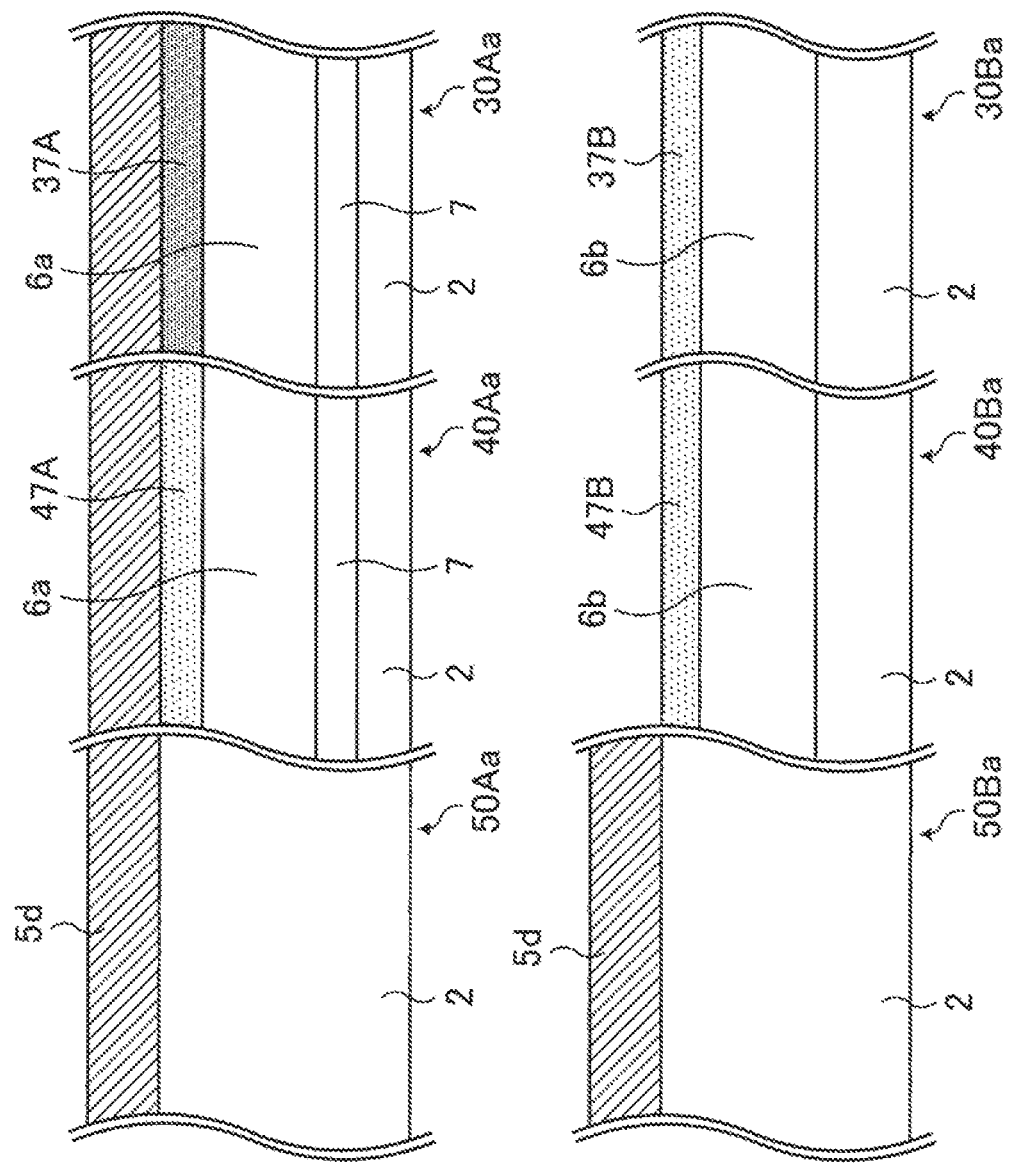
FIG. 13 illustrates an example of manufacturing step for the semiconductor device to the second embodiment.

FIG. 13 illustrates an example of the fourth manufacturing step of the semiconductor device according to the second embodiment.

After the formation of the p-type impurity region 37A the additional implantation, a resist pattern 5d is formed as illustrated in FIG. 13. The resist pattern 5d covers the element region 50Ba, the element region 50Aa, the element region 40Aa, and the element region 30Aa, and has openings in the element region 40Ba and the element region 30Ba. By the use of this resist pattern 5d as a mask, n-type impurity implantation is performed, and a common n-type well region 6b, and an n-type impurity region 47B and an n-type impurity region 37B are formed in the semiconductor substrate 2 in the element region 40Ba and the element region 30Ba. The n-type impurity region 47B is a region having a comparatively high concentration provided under a channel region 46B (FIG. 31) of the p-channel type very low leak transistor 40B. The n-type impurity region 37B is a region having a comparatively high concentration provided under a channel region 36B (FIG. 31) of the p-channel type standard transistor 30B.

The impurity implantation for forming the n-type well region 6b, the n-type impurity region 47B, and the n-type impurity region 37B is performed under the following conditions, for example. Phosphorus is implanted under the conditions of an acceleration energy of 330 keV and a dose amount of $3 \times 10^{13}$ $cm^{-3}$. Antimony (Sb) is implanted under the conditions of an acceleration energy of 130 keV and a dose amount of $6 \times 10^{12}$ $cm^{-3}$. Antimony is implanted under the conditions of an acceleration energy of 80 keV and a dose amount of $1 \times 10^{13}$ $cm^{-3}$. Antimony is implanted under the conditions of an acceleration energy of 20 keV and a dose amount of $3 \times 10^{12}$ $cm^{-3}$. By the implantation of these impurities in the respective conditions, the n-type well region 6b, the n-type impurity region 47B, and the n-type impurity region 37B are formed in the semiconductor substrate 2. The resist pattern 5d is removed after the impurity implantation.

Figure 14:
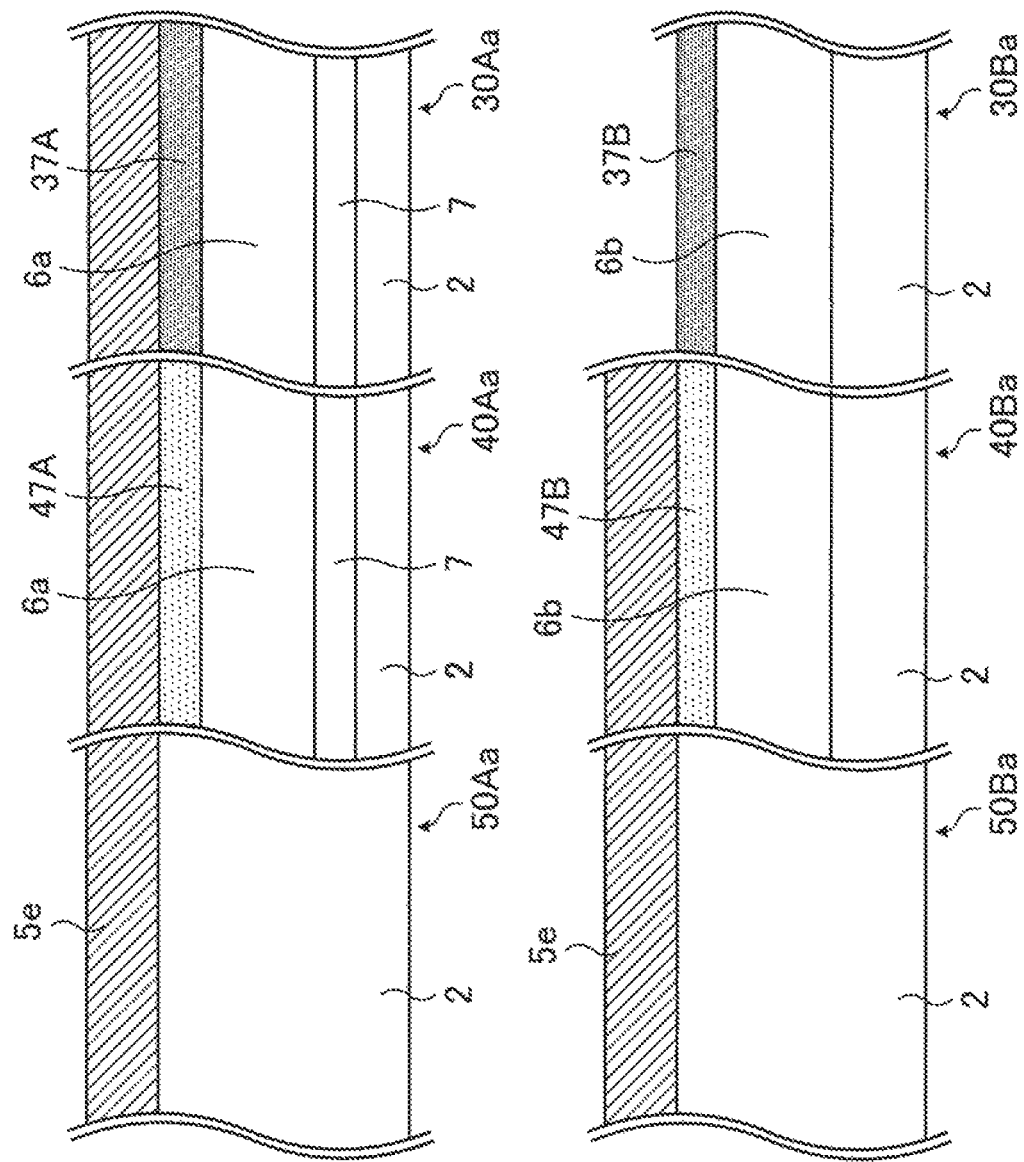
FIG. 14 illustrates an example of manufacturing step for the semiconductor device to the second embodiment.

FIG. 14 illustrates an example of the fifth manufacturing step of the semiconductor device according to the second embodiment.

After the formation of the n-type well region 6b, the n-type impurity region 47B, and the n-type impurity region 37B, a resist pattern 5e is formed as illustrated in FIG. 14. The resist, pattern 5e covers the element region 50Ba, the element region 40Ba, the element region 50Aa, the element region 40Aa and the element region 30Aa, and has an opening in the element, region 30Ba. By the use of this resist pattern 5e as a mask, n-type impurity implantation is performed additionally, and the n-type impurity region 37B in the element region 30Ba is caused to have a further higher concentration. The impurity implantation thereof is performed by the implantation of antimony under the conditions of an acceleration energy of 20 keV and a dose amount of $3\times10^{12}$ cm$^{-3}$, for example. Thereby, the n-type impurity region 37B having a higher concentration than the n-type impurity region 47B in the element region 40Ba for the very low leak transistor 40B is formed in the element region 30Ba for the standard transistor 309. The resist pattern 5e is removed after the impurity implantation.

Figure 15:
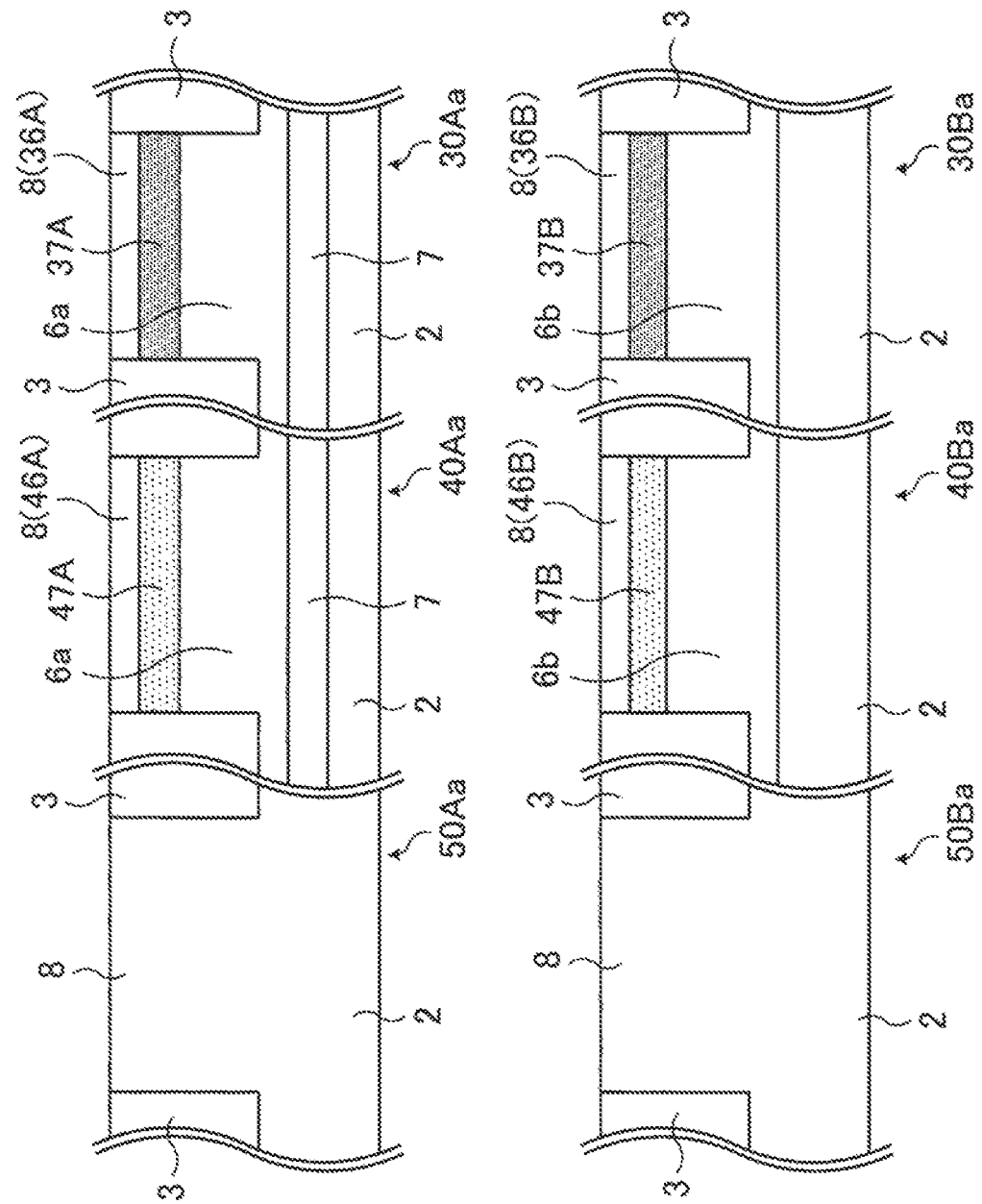
FIG. 15 illustrates an example of manufacturing step for the semiconductor device to the second embodiment.

FIG. 15 illustrates an example of the sixth manufacturing step of the semiconductor device according to the second embodiment.

After the formation of the n-type impurity region 37B by the additional implantation, a semiconductor material is grown epitaxially on the semiconductor substrate 2. For example, when a silicon substrate is used as the semiconductor substrate 2, silicon which is the same kind of semiconductor material is grown epitaxially in a film thickness of 25 nm on the semiconductor substrate 2. By this epitaxial growth, as illustrated in FIG. 15, a semiconductor layer 8 (non-doped layer) is formed on the p-type impurity region 47A in the element region 40Aa, the p-type impurity region 37A in the element region 30Aa, the n-type impurity region 47B in the element region 40Ba, and the n-type impurity region 37B in the element region 30Ba. In this semiconductor layer 8, the respective channel regions 46A and 46B of the very low leak transistors 40A and 40B are formed and the respective channel regions 36A and 36B of the standard transistors 30A and 30B are formed. Note that the semiconductor layer 8 is formed similarly also in the element region 50Aa and the element region 50Ba by the epitaxial growth. Here, explanation will be made assuming that the semiconductor layer 8 is united with the semiconductor substrate 2 (as a part of the semiconductor substrate 2).

Note that, when a protection film of an oxide film or the like is formed on the semiconductor substrate 2, the semiconductor layer 8 is formed after the removal thereof.

After the formation of the semiconductor layer 8, as illustrated in FIG. 15, element isolation regions 3 are formed for defining the element region 50Aa, the element region 40Aa, the element region 30Aa, the element region 50Ba, the element region 40Ba, and the element region 30Ba.

Figure 16:
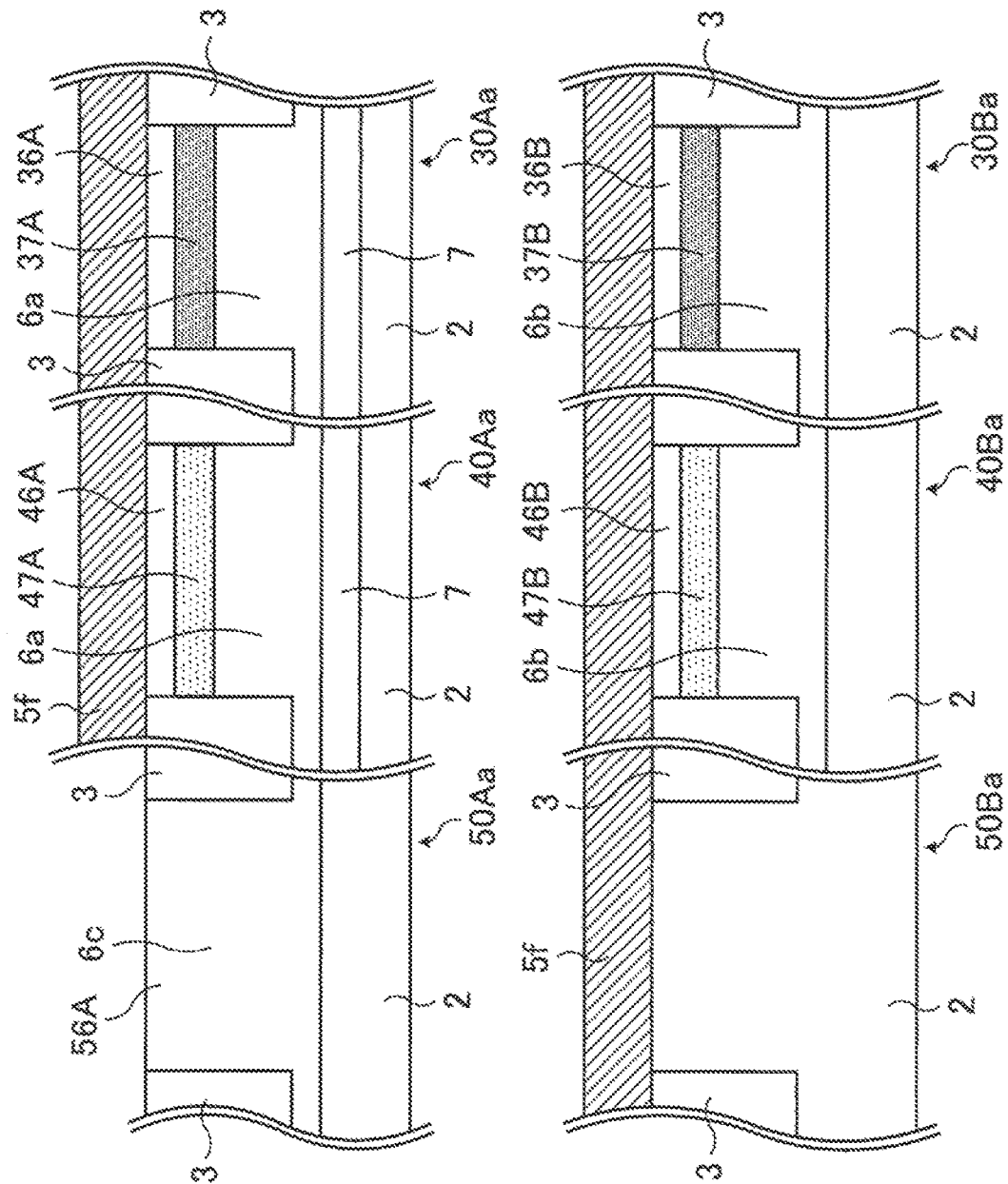
FIG. 16 illustrates an example of a seventh manufacturing step for the semiconductor device according to the second embodiment.

FIG. 16 illustrates an example of the seventh manufacturing step of the semiconductor device according to the second embodiment.

After the formation of the element isolation regions 3, as illustrated in FIG. 16, a resist, pattern 5f is formed having an opening in the element region 50Aa, and p-type impurity implantation is performed by the use of this resist pattern 5f as a mask to form a p-type well region 6c in the semiconductor substrate 2 in the element region 50Aa. The impurity implantation for forming the p-type well region 6c is performed by the implantation of boron under the conditions of an acceleration energy of 150 KeV and a dose amount of $3\times10^{13}$ cm$^{-3}$ and the implantation of boron fluoride under the conditions of an acceleration energy of 15 keV and a dose amount of $3\times10^{12}$ cm$^{-3}$, for example. A channel region 56A of the I/O transistor 50A is formed in this p-type well region 6c. The resist pattern 5f is removed after the impurity implantation.

Here, before this impurity implantation (before the formation of the resist pattern 5f), an oxide film such as a silicon oxide film (un-illustrated) may be formed on the semiconductor layer 8 as a protection film thereof.

Figure 17:
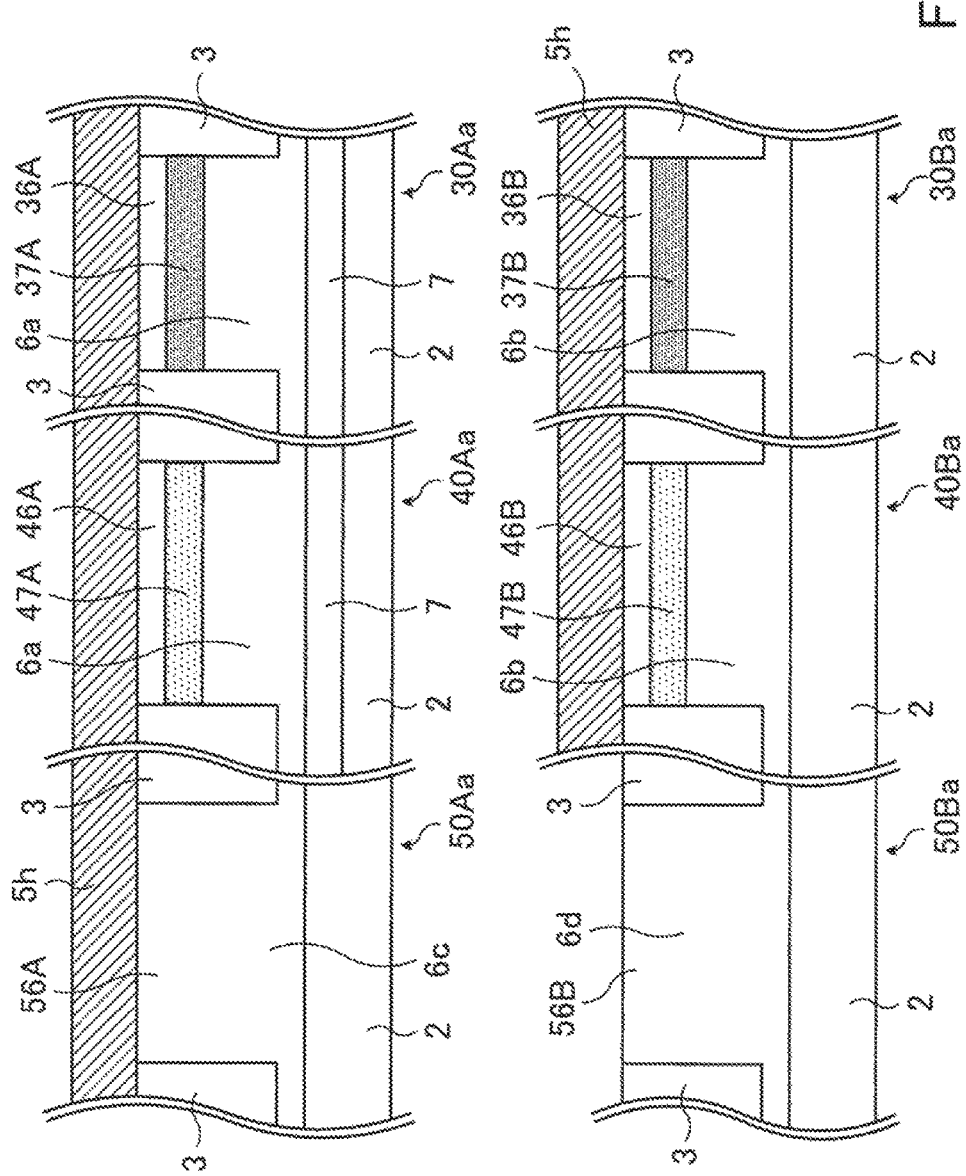
FIG. 17 illustrates an example of an eighth manufacturing step for the semiconductor device according to the second embodiment.

FIG. 17 Illustrates an example of the eighth manufacturing step of the semiconductor device according to the second embodiment.

After the formation of the p-type well region 6c, as illustrated in FIG. 17, a resist pattern 5h is formed having an opening in the element region 50Ba, and n-type impurity implantation is performed by the use of this resist pattern 5h as a mask to form an n-type well region 6d in the semiconductor substrate 2 in the element region 50Ba. The impurity implantation for forming the n-type well region 6d is performed by the implantation of phosphorus under the conditions of an acceleration energy of 360 keV and a dose amount of $3\times10^{13}$ cm$^{-3}$ and the implantation of arsenide under the conditions of an acceleration energy of 100 keV and a dose amount of $1\times10^{12}$ cm$^{-3}$, for example. A channel region 56B of the I/O transistor 50B is formed in this n-type well region 6d. The resist pattern 5h is removed after the impurity implantation.

Figure 18:
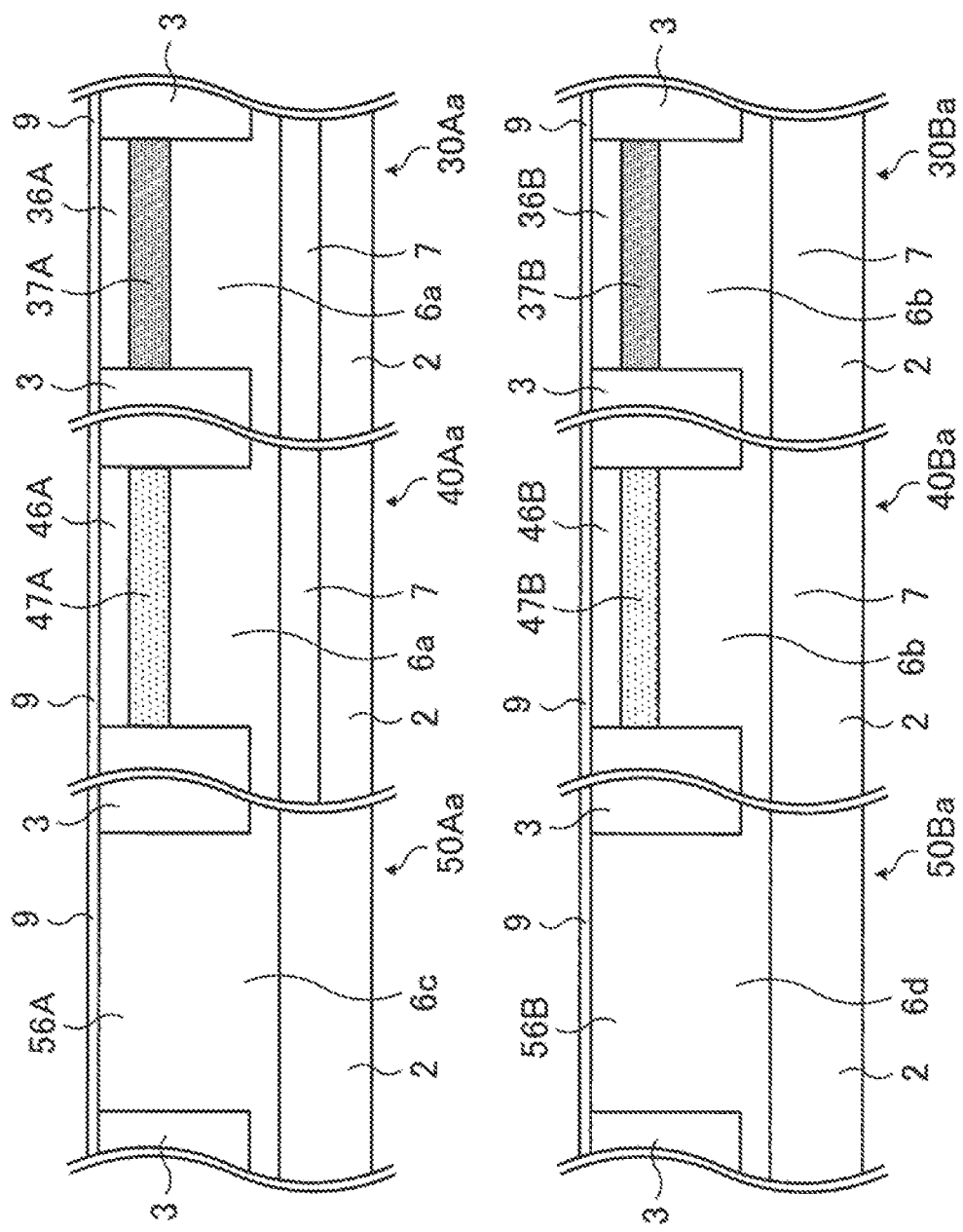
FIG. 18 illustrates an example of a ninth manufacturing step for the semiconductor device according to the second embodiment.

FIG. 18 illustrates an example of the ninth manufacturing step of the semiconductor device according to the second embodiment.

After the formation of the n-type well region 6d, as illustrated in FIG. 18, an oxide film 9 is formed on the surfaces of the element region 50Aa, the element region 40Aa, the element region 30Aa, the element region 50Ba, the element region 40Ba, and the element region 30Ba. The oxide film 9 is formed in a film thickness of 5 nm by the use of a thermal oxidation method, for example.

When a protection film of an oxide film or the like is formed on the semiconductor layer 8, the oxide film 9 is formed after the removal thereof.

Figure 19:
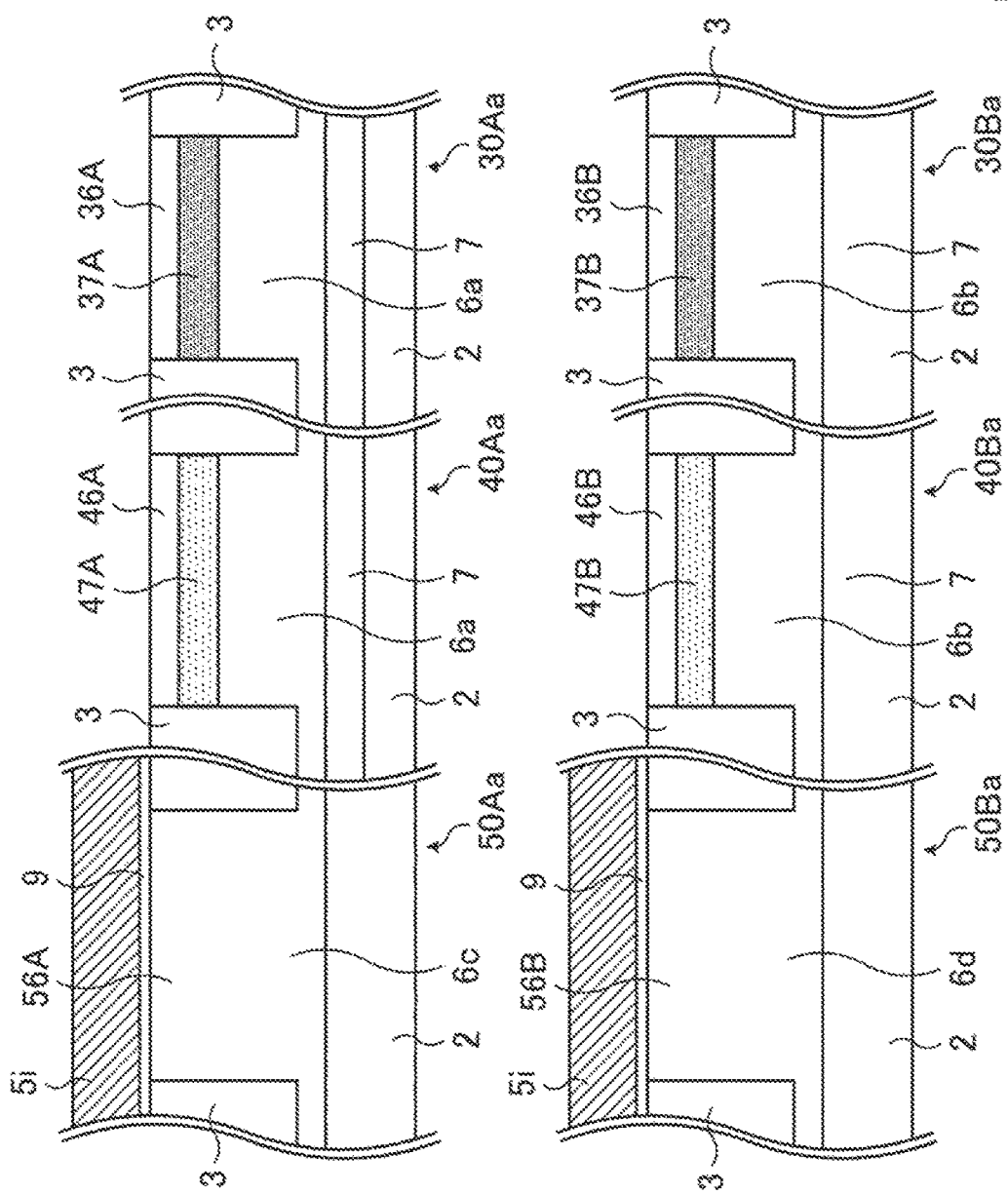
FIG. 19 illustrates an example of a tenth manufacturing step for the semiconductor device according to the second embodiment.
Figure 20:
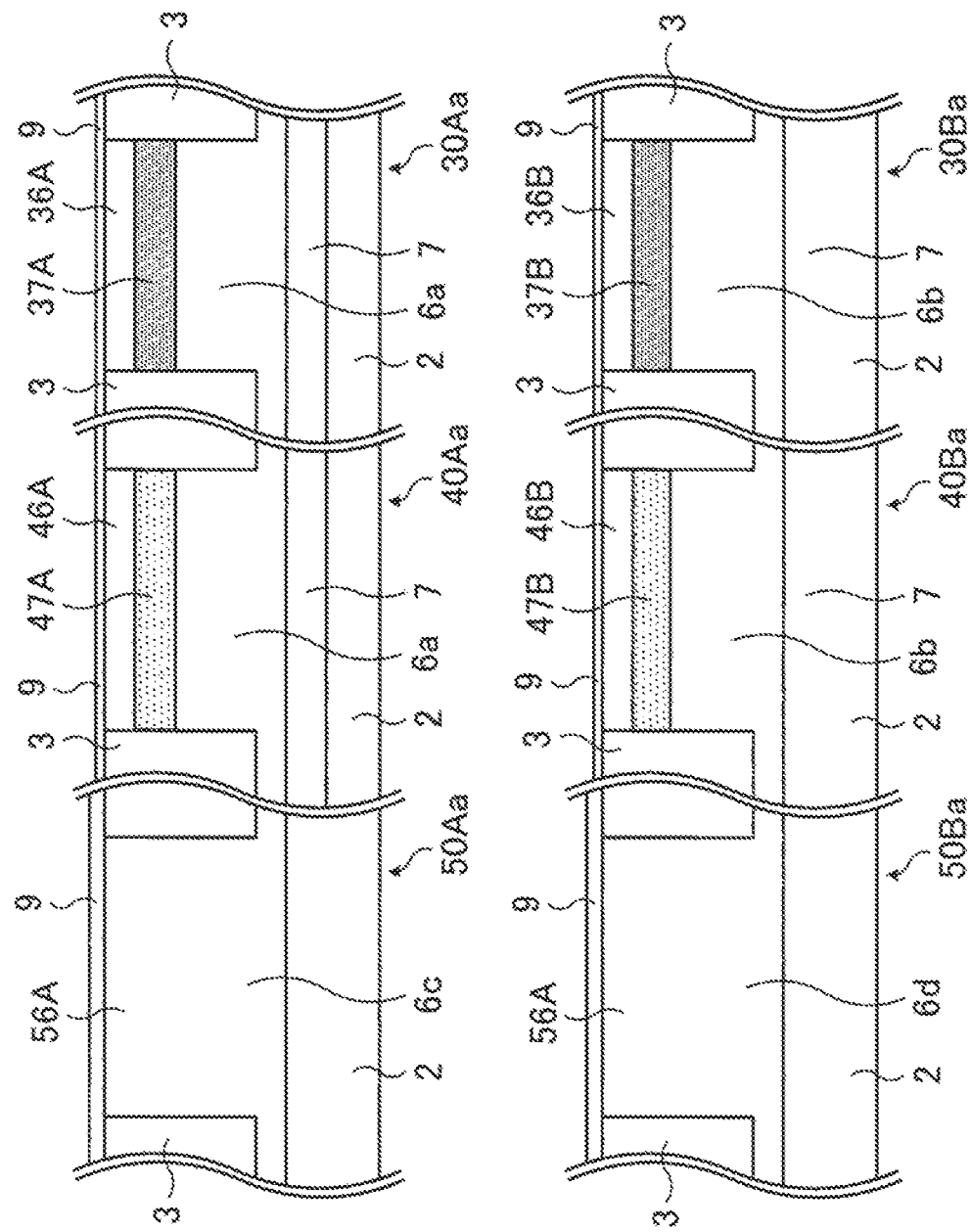
FIG. 20 illustrates an example of an eleventh manufacturing step for the semiconductor device according to the second embodiment.

FIG. 19 illustrates an example of the tenth manufacturing step of the semiconductor device according to the second embodiment, and FIG. 20 illustrates an example of the eleventh manufacturing step of the semiconductor device according to the second embodiment.

After the formation of the oxide film 9, as illustrated in FIG. 19, a resist pattern 5i is formed having openings in the element region 40Aa, the element region 30Aa, the element region 40Ba, and the element region 30Ba, and etching is performed by the use of this resist pattern 5i as a mask to remove a part of the oxide film 9. Then, after the removal of the resist pattern 5i, re-oxidation is performed by the use of the thermal oxidation method, for example. By this re-oxidation, as illustrated in FIG. 20, an oxide film 9 is formed having a film thickness of 4 nm, for example, in the element region 40Aa, the element region 30Aa, the element region 40Ba, and the element region 30Ba. By this re-oxidation, the oxide film 9 having an increased film thickness is formed in the element region 50Aa and the element region 50Ba.

Figure 21:
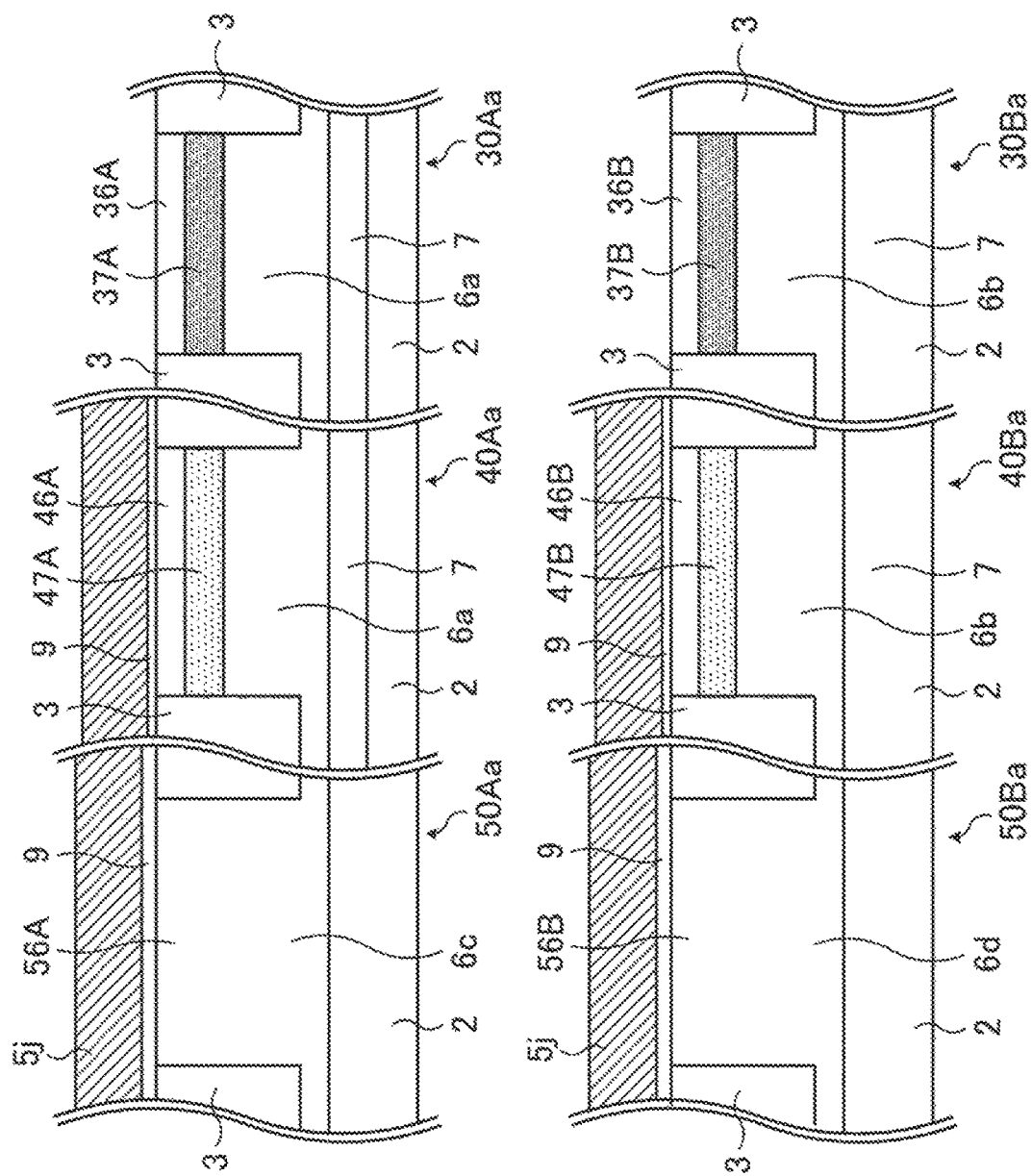
FIG. 21 illustrates an example of a twelfth manufacturing step for the semiconductor device according to the second embodiment.
Figure 22:
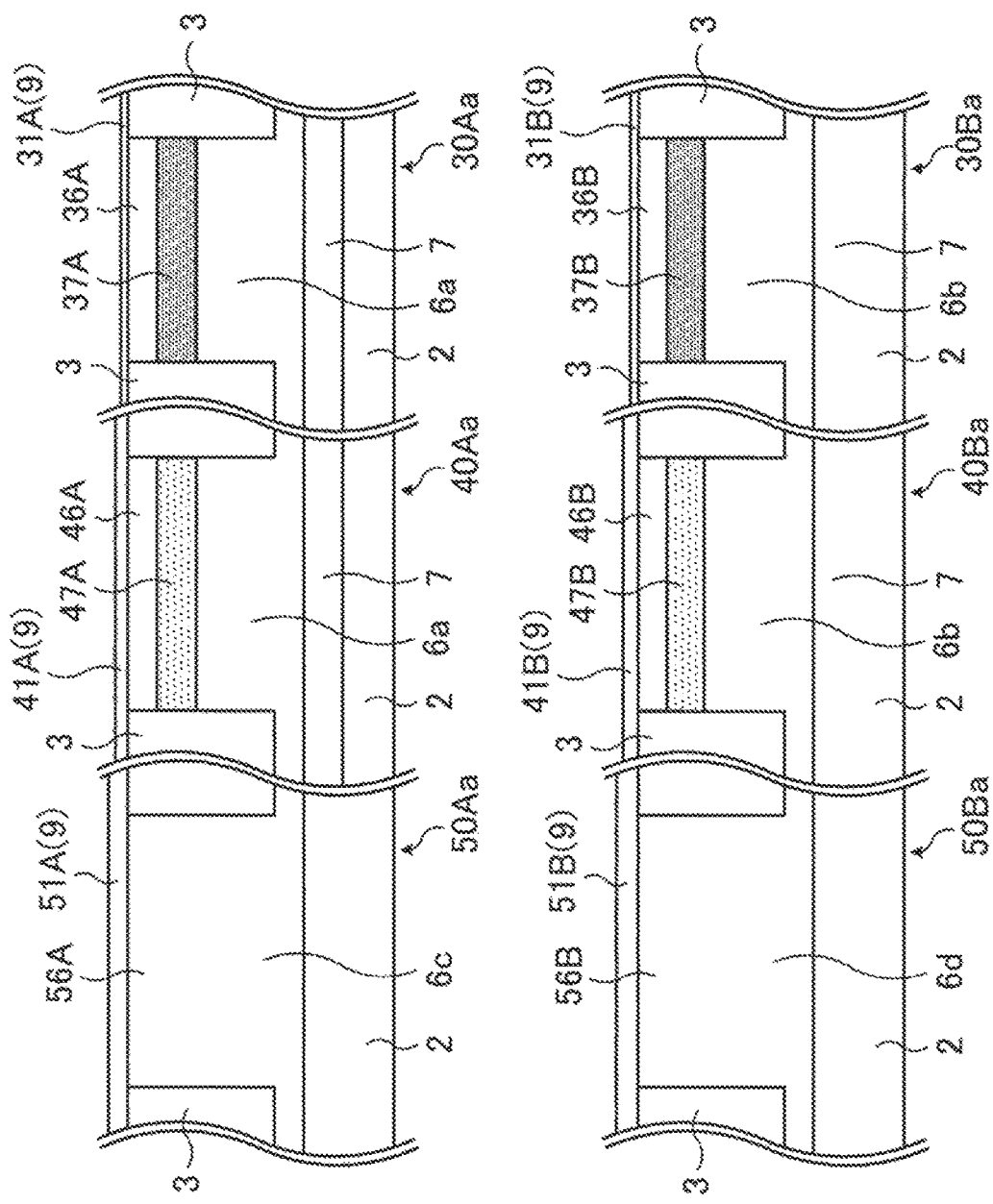
FIG. 22 illustrates an example of a thirteenth manufacturing step for the semiconductor device according to the second embodiment.

FIG. 21 illustrates an example of the twelfth manufacturing step of the semiconductor device according to the second embodiment, and FIG. 22 illustrates an example of the thirteenth manufacturing step of the semiconductor device according to the second embodiment.

Subsequently, as illustrated in FIG. 21, a resist pattern 5j is formed having openings in the element region 30Aa and the element region 30Ba, and etching is performed by the use of this resist pattern 5j as a mask to remove a part of the oxide film 9. Then, after the removal of the resist pattern 5j, re-oxidation is performed by the use of the thermal oxidation method, for example. By this re-oxidation, as illustrated in FIG. 22, an oxide film 9 is formed having a film thickness of 1.8 nm, for example, in the element region 30Aa and the element region 30Ba. By this re-oxidation, the oxide film 9 is formed having an increased film thickness in the element region 40Aa and the element region 40Ba, and the oxide film 9 are formed having a further increased thickness in the element region 50Aa and the element region 50Ba.

Thereby, respective gate insulating films 51A and 51B of the I/O transistors 50A and 50B, respective gate insulating films 41A and 41B of the very low leak transistors 40A and 40B, and respective gate insulating films 31A and 31B of the standard transistors 30A and 30B are formed. The thickness of the gate insulating films 51A and 51B is the largest, the thickness of the gate insulating films 31A and 31B is the smallest, and the gate insulating films 41A and 41B have a thickness therebetween. The gate insulating film 41A in the element region 40Aa for the very low leak transistor 40A is formed thicker than the gate insulating film 31A in the element region 30Aa for the standard transistor 30A. The gate insulating film 41B in the element region 40Ba for the very low leak transistor 40B is formed thicker than the gate insulating film 31B in the element region 30Ba for the standard transistor 30B.

Figure 23:
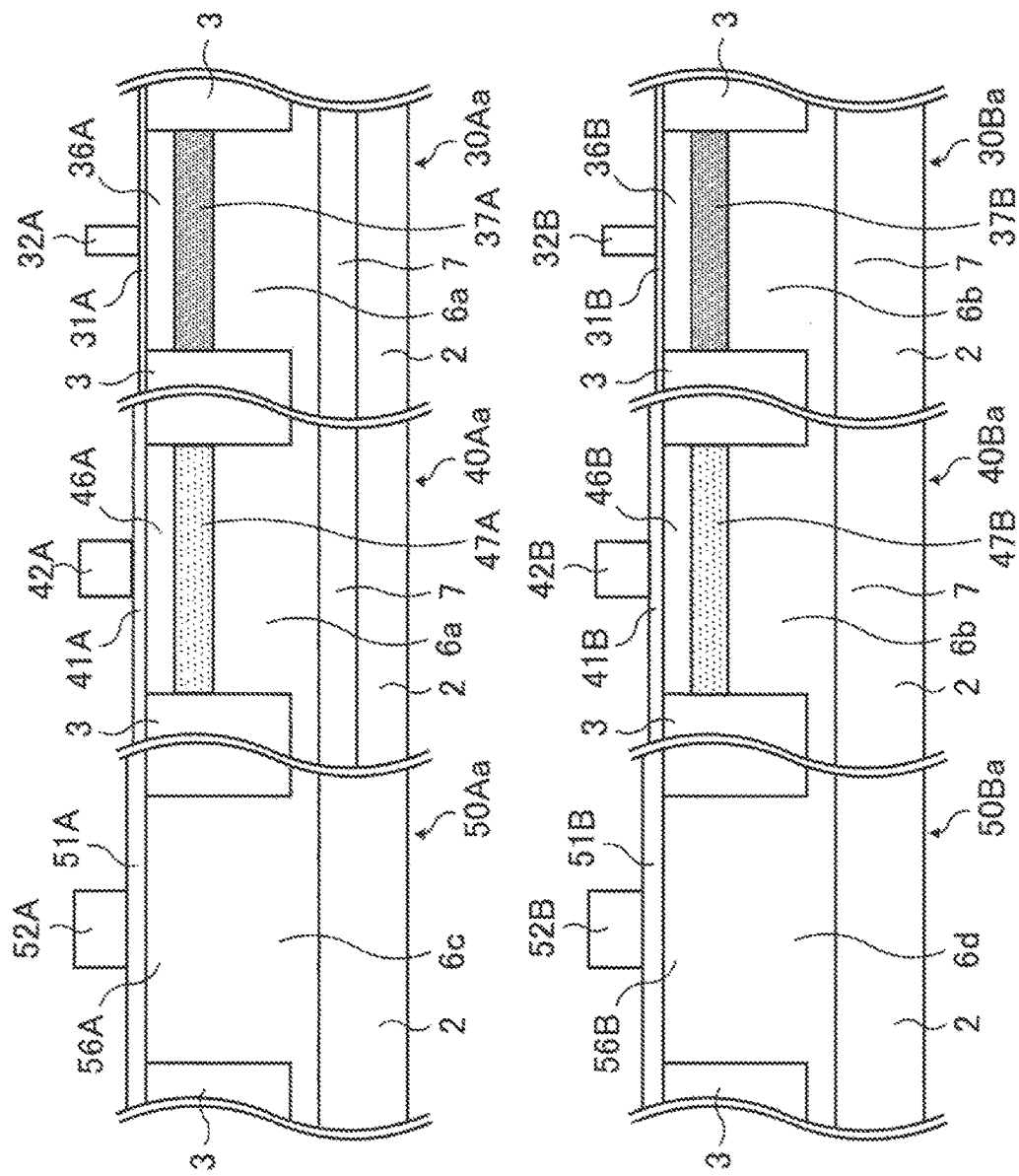
FIG. 23 illustrates an example of a fourteenth manufacturing step for the semiconductor device according to the second embodiment.

FIG. 23 illustrates an example of the fourteenth manufacturing step of the semiconductor device according to the second embodiment.

After the formation of the gate insulating films 51A and 51B, the gate insulating films 41A and 41B, and the gate insulating films 31A and 31B, as illustrated in FIG. 23, poly-silicon which is a gate electrode material is formed having a predetermined film thickness (e.g., 100 nm), and the patterning thereof is performed. Thereby, a gate electrode 52A of the I/O transistor 50A is formed on the gate insulating film 51A in the element region 50Aa. A gate electrode 42A of the very low leak transistor 40A is formed on the gate insulating film 41A in the element region 40Aa. A gate electrode 32A of the standard transistor 30A is formed on the gate insulating film 31A in the element region 30Aa. A gate electrode 52B of the I/O transistor 50B is formed on the gate insulating film 51B in the element region 50Ba. A gate electrode 42B of the very low leak transistor 40B is formed on the gate insulating film 41B in the element region 40Ba. A gate electrode 32B of the standard transistor 30B is formed on the gate insulating film 31B in the element region 30Ba.

In this example, the gate electrodes 52A and 52B have the largest gate length, the gate electrodes 32A and 32B have the smallest gate length, and the gate electrodes 42A and 42B have a gate length therebetween. The gate length of the gate electrode 42A in the very low leak transistor 40A is made larger than the gate length of the gate electrode 32A in the standard transistor 30A. The gate length of the gate electrode 42B in the very low leak transistor 40B is made larger than the gate length of the gate electrode 32B in the standard transistor 30B.

Figure 24:
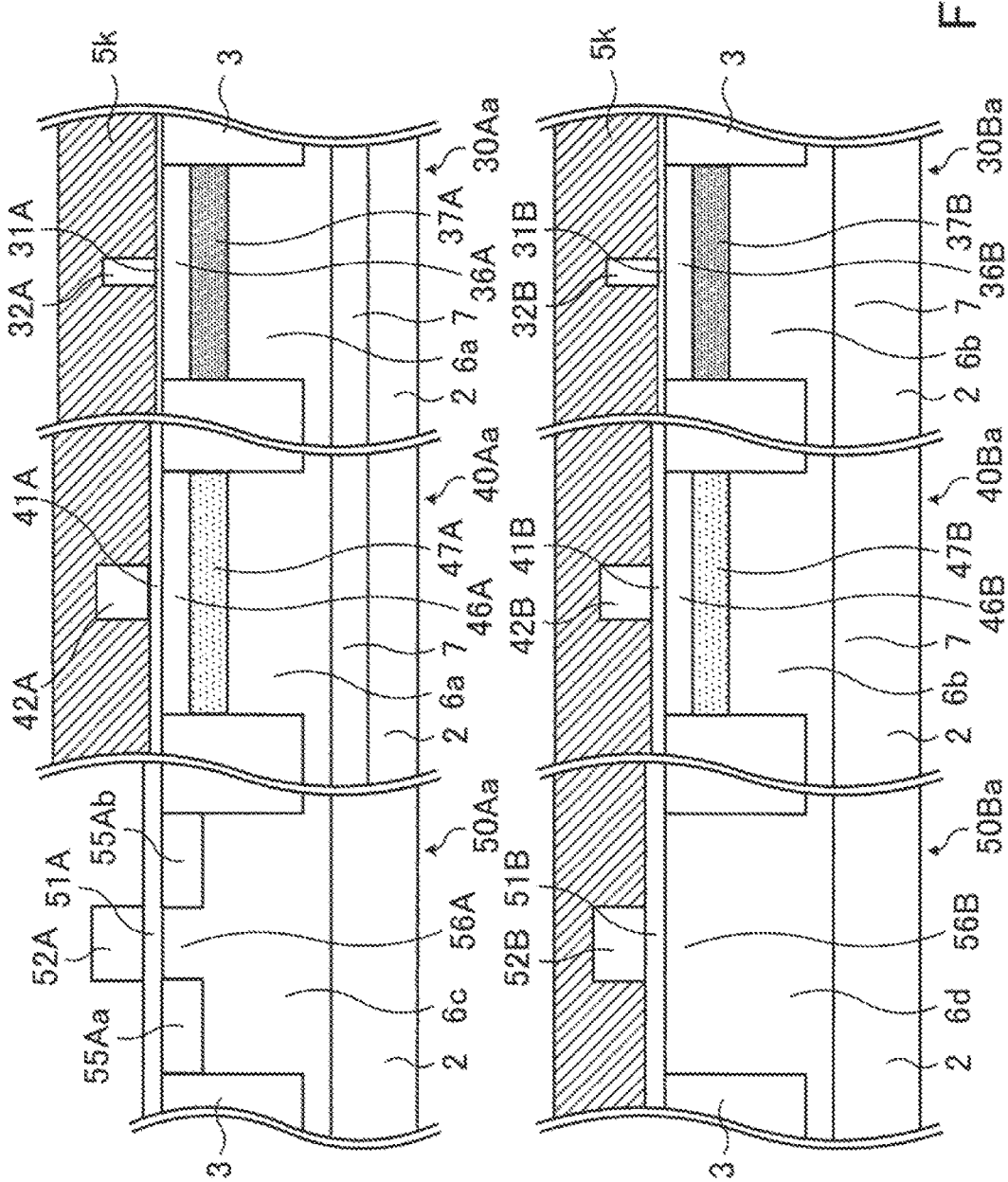
FIG. 24 illustrates an example of a fifteenth manufacturing step for the semiconductor device according to the second embodiment.
Figure 25:
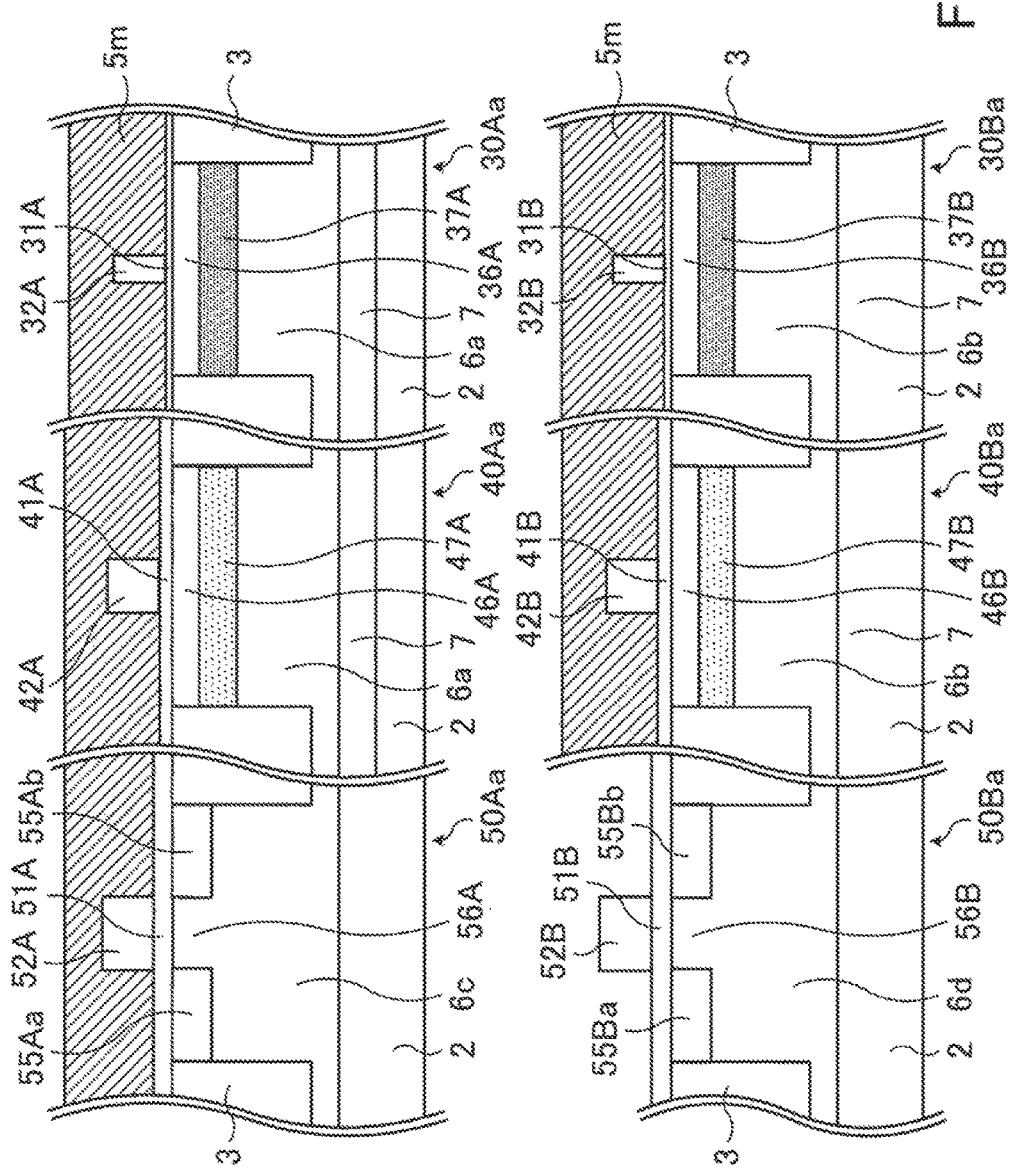
FIG. 25 illustrates an example of a sixteenth manufacturing step for the semiconductor device according to the second embodiment.

FIG. 24 illustrates an example of the fifteenth manufacturing step of the semiconductor device according to the second embodiment, and FIG. 25 illustrates an example of the sixteenth manufacturing step of the semiconductor device according to the second embodiment.

After the formation of the gate electrodes 52A and 52B, the gate electrodes 42A and 42B, and the gate electrodes 32A and 32B, as illustrated in FIG. 24, a resist pattern 5$k$ is formed having an opening in the element region 50Aa, and n-type impurity implantation is performed by the use of this resist pattern 5$k$ as a mask. By this impurity implantation, an n-type LDD region 55Aa and an n-type LDD region 55Ab are formed in the semiconductor substrate 2 on both sides of the gate electrode 52A in the element region 50Aa. The impurity implantation for forming the n-type LDD region 55Aa and the n-type LDD region 55Ab is performed by the implantation of phosphorus under the conditions of an acceleration energy of 35 keV and a dose amount of $3\times10^{13}$ $cm^{-3}$, for example. The resist pattern 5$k$ is removed after the impurity implantation.

Subsequently, as illustrated in FIG. 25, a resist pattern 5$m$ is formed having an opening in the element region 50Ba, and p-type impurity implantation is performed by the use of this resist pattern 5$m$ as a mask. By this impurity implantation, a p-type LDD region 55Ba and a p-type LDD region 55Bb are formed in the semiconductor substrate 2 on both sides of the gate electrode 52B in the element region 50Ba. The impurity implantation for forming the p-type LDD region 55Ba and the p-type LDD region 55Bb is performed by the implantation under the condition of boron at an acceleration energy of 2 keV in a dose amount of $3\times10^{13}$ $cm^{-3}$, for example. The resist pattern 5$m$ is removed after the impurity implantation.

Figure 26:
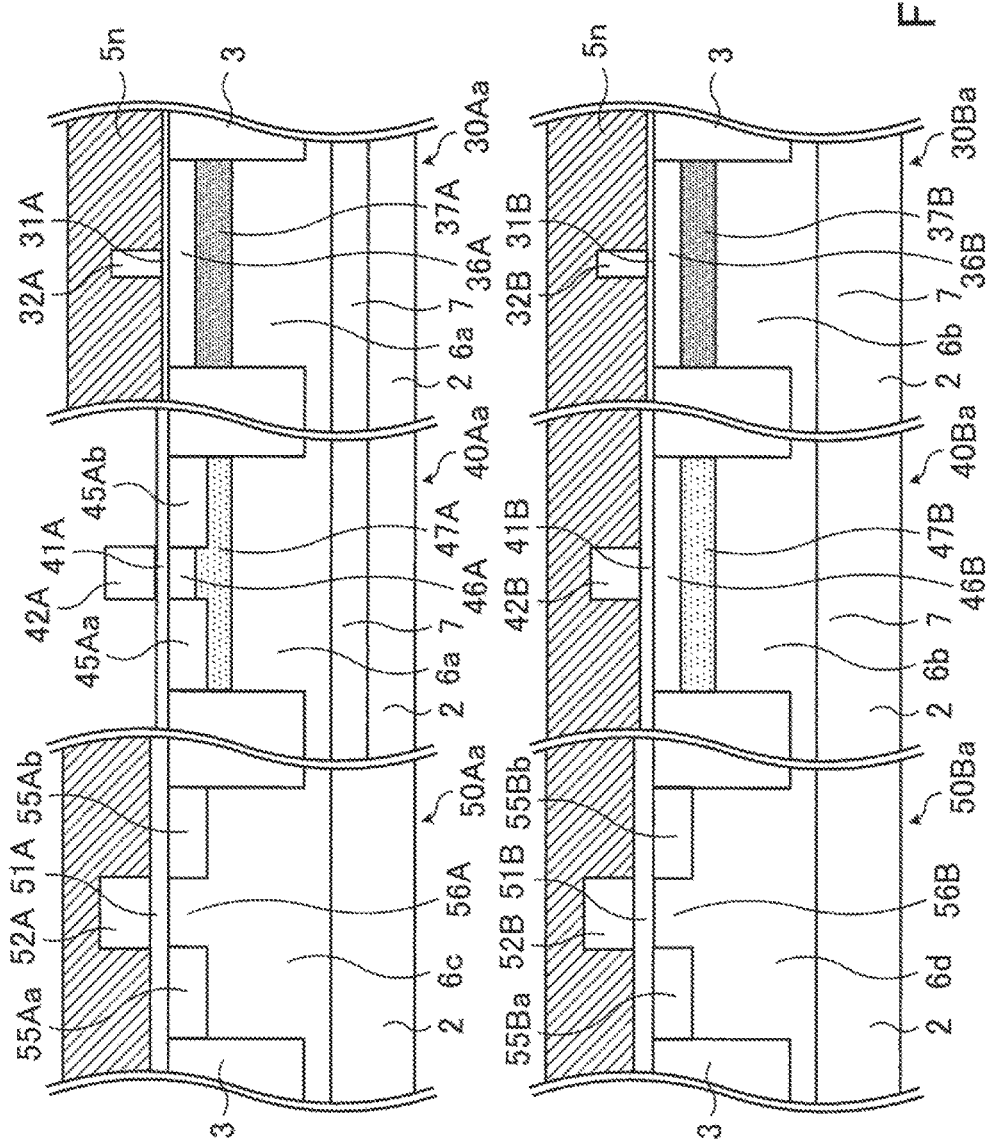
FIG. 26 illustrates an example of a seventeenth manufacturing step for the semiconductor device according to the second embodiment.
Figure 27:
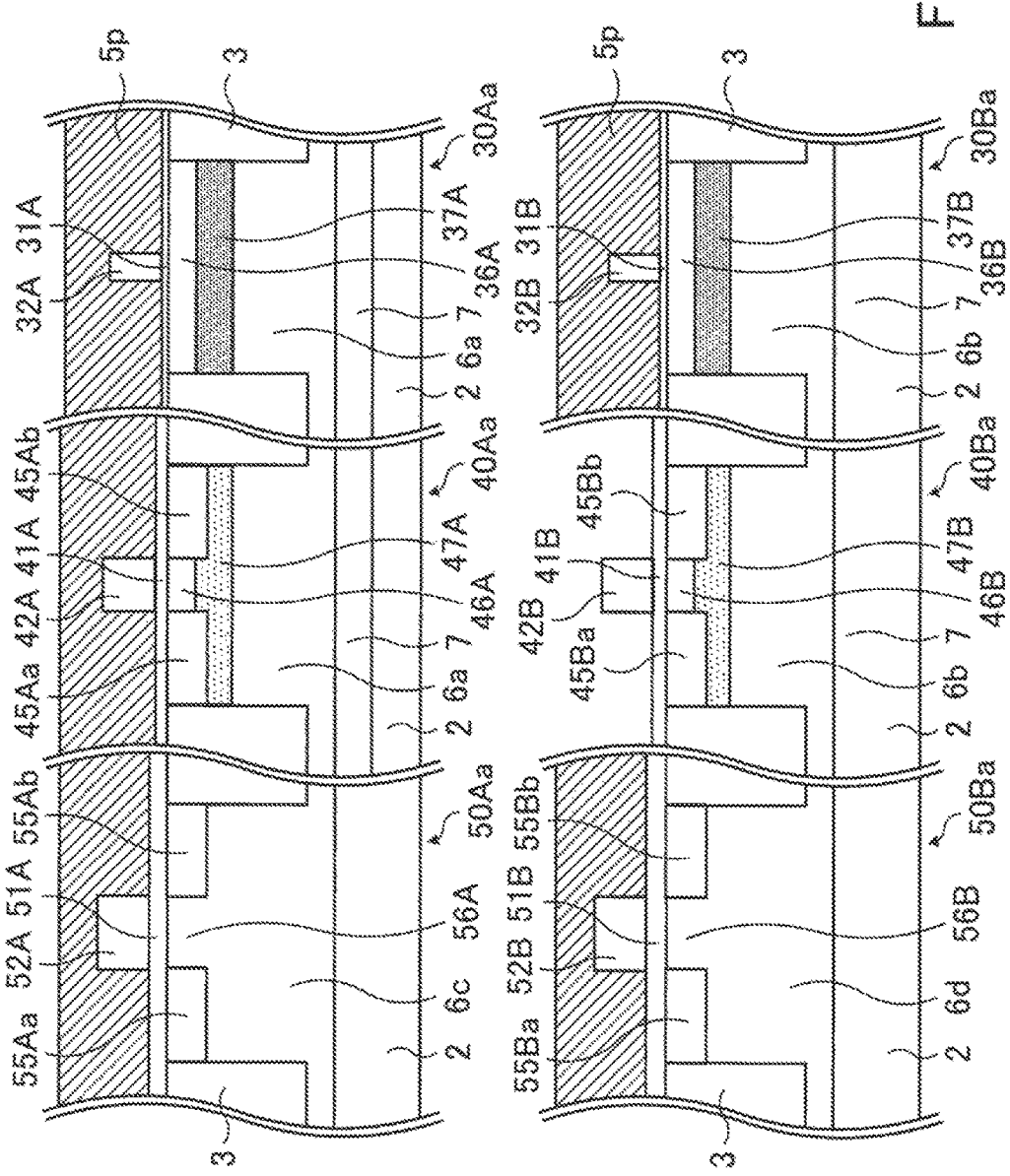
FIG. 27 illustrates an example of an eighteenth manufacturing step for the semiconductor device according to the second embodiment.

FIG. 26 illustrates an example of the seventeenth manufacturing step of the semiconductor device according to the second embodiment, and FIG. 27 illustrates an example of the eighteenth manufacturing step of the semiconductor device according to the second embodiment.

As illustrated in FIG. 26, a resist pattern 5$n$ is formed having an opening in the element region 40Aa, and n-type impurity implantation is performed by the use of this resist pattern 5$n$ as a mask. By this impurity implantation, an n-type LDD region 45Aa and an n-type LDD region 45Ab are formed in the semiconductor substrate 2 on both sides of the gate electrode 42A in the element region 40Aa. The impurity implantation for forming the n-type LDD region 45Aa and the n-type LDD region 45Ab is performed by the implantation of arsenide under the conditions of an acceleration energy of 1.5 keV and a dose amount of $2\times10^{14}$ $cm^{-3}$, for example. The resist pattern 5$n$ is removed after the impurity implantation.

Subsequently, as illustrated in FIG. 27, a resist pattern 5$p$ is formed having an opening in the element region 40Ba, and p-type impurity implantation is performed by the use of this resist pattern 5$p$ as a mask. By this impurity implantation, a p-type LDD region 45Ba and a p-type LDD region 45Bb are formed in the semiconductor substrate 2 on both sides of the gate electrode 42B in the element region 40Ba. The impurity implantation for forming the p-type LDD region 45Ba and the p-type LDD region 45Bb is per formed by the implantation of boron under the conditions of an acceleration energy of 0.5 keV and a dose amount of $1\times10^{14}$ $cm^{-3}$, for example. The resist pattern 5$p$ is removed after the impurity implantation, FIG. 28 illustrates an example of the nineteenth manufacturing step of the semiconductor device according to the second embodiment, and FIG. 29 illustrates an example of the twentieth manufacturing step of the semiconductor device according to the second embodiment.

Figure 28:
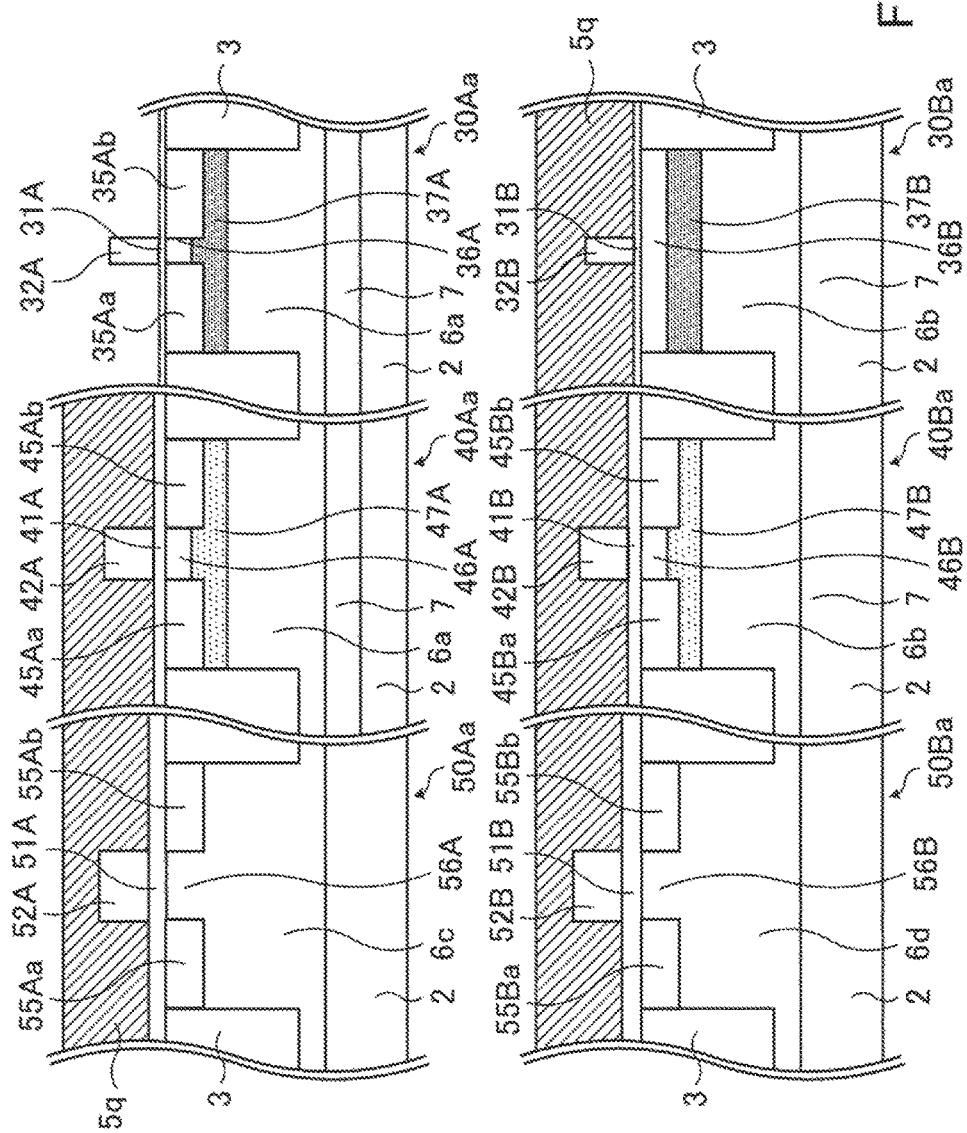
FIG. 28 illustrates an example of a nineteenth manufacturing step for the semiconductor device according to the second embodiment.

As illustrated in FIG. 28, a resist pattern 5$q$ is formed having an opening in the element region 30Aa, and n-type impurity implantation is performed by the use of this resist pattern 5$q$ as a mask. By this impurity implantation, an n-type LDD region 35Aa and an n-type LDD region 35Ab are formed in the semiconductor substrate 2 on both sides of the gate electrode 32A in the element region 30Aa. The impurity implantation for forming the n-type LDD region 35Aa and the n-type LDD region 35Ab is performed by the implantation of arsenide under the conditions of an acceleration energy of 1.5 keV and a dose amount of $1\times10^{15}$ $cm^{-3}$, for example. The resist pattern 5$q$ is removed after the impurity implantation.

Figure 29:
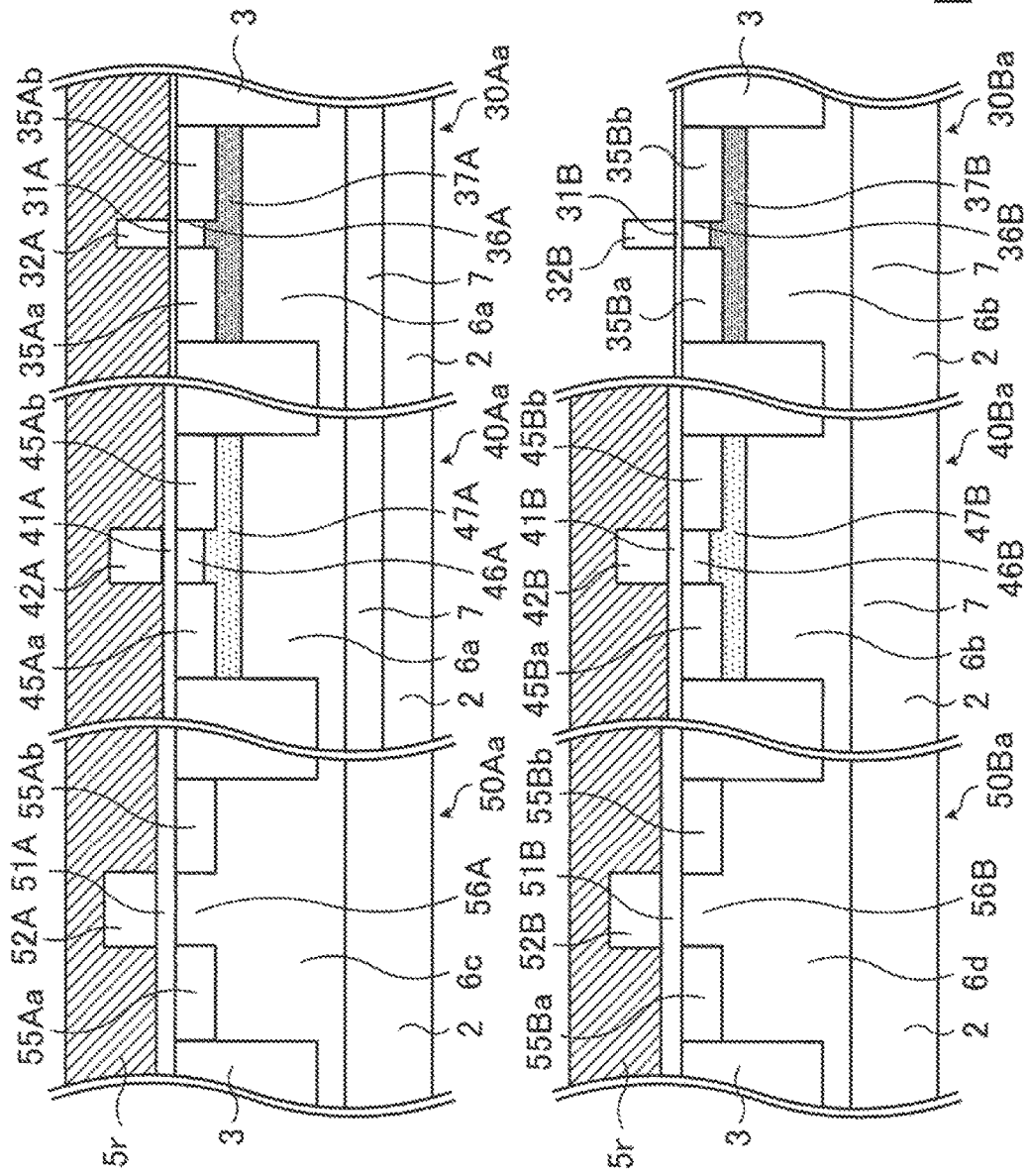
FIG. 29 illustrates an example of a twentieth manufacturing step for the semiconductor device according to the second embodiment.

Subsequently, as illustrated in FIG. 29, a resist pattern 5$r$ is formed having an opening in the element region 30Ba, and p-type impurity implantation is performed by the use of this resist pattern 5r as a mask. By this impurity implantation, a p-type LDD region 35Ba and a p-type LDD region 35Bb are formed in the semiconductor substrate 2 on both sides of the gate electrode 32B in the element region 30Ba. The impurity implantation for forming the p-type LDD region 35Ba and the p-type LDD region 35Bb is performed under the following conditions, for example. Germanium is implanted under the conditions of an acceleration energy of 2 keV and a dose amount of $1\times10^{15}$ cm$^{-3}$. Fluorine is implanted under the conditions of an acceleration energy of 2 keV and a dose amount of $3\times10^{14}$ cm$^{-3}$. Boron is implanted under the conditions of an acceleration energy of 0.5 keV and a dose amount of $4\times10^{14}$ cm$^{-3}$. The resist pattern 5r is removed after the impurity implantation.

Figure 30:
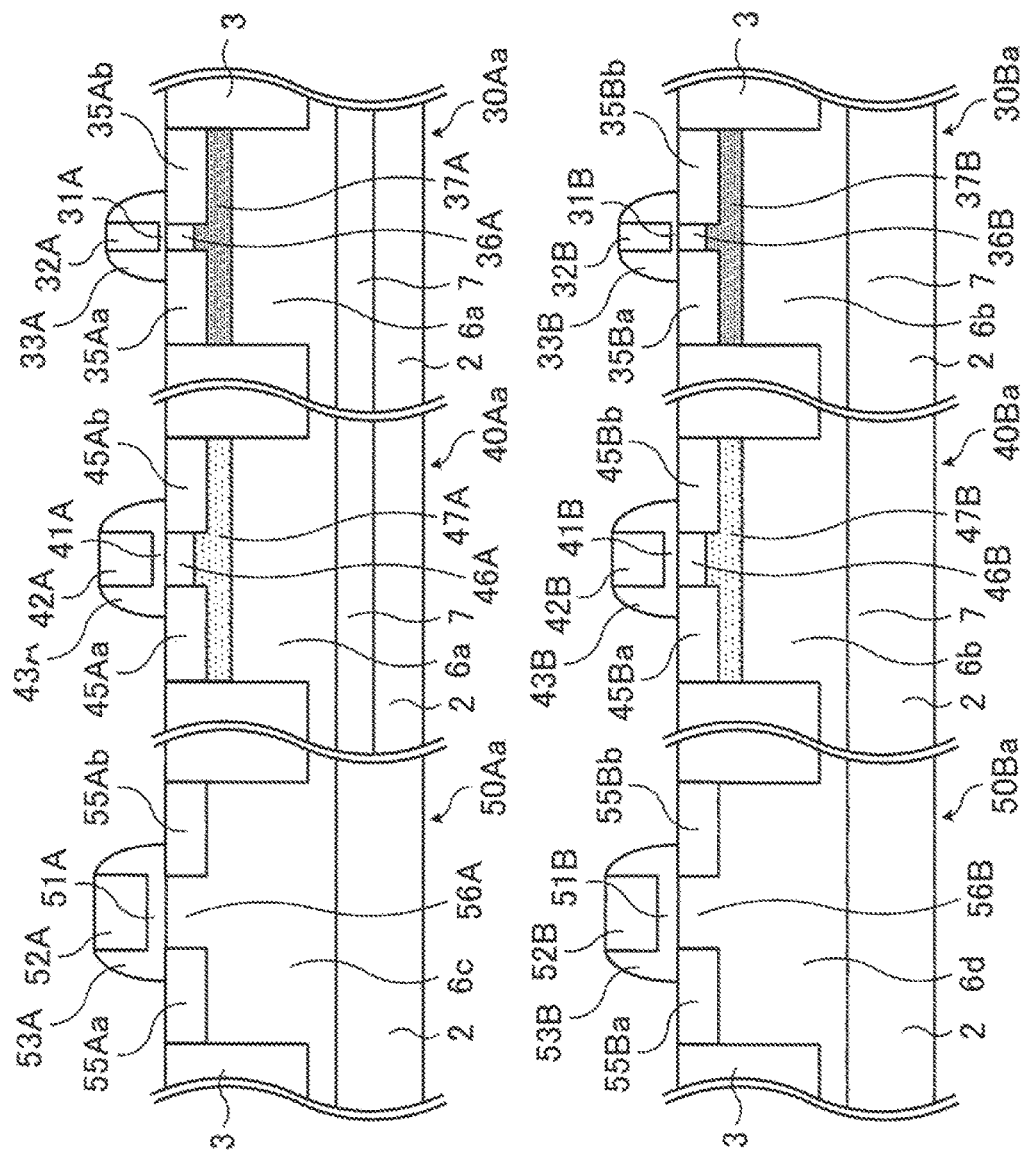
FIG. 30 illustrates an example of a twenty-first manufacturing step for the semiconductor device according to the second embodiment.

FIG. 30 illustrates an example of the twenty-first manufacturing step of the semiconductor device according to the second embodiment.

After the above steps, an insulating film is formed on the semiconductor substrate 2. A silicon oxide film is formed having a thickness of 70 nm as the insulating film, for example. Then, the formed insulating film is etched back. Thereby, side wall insulating films 53A are formed on the side walls of the gate electrode 52A in the element region 50Aa, side wall insulating films 43A are formed on the side walls of the gate electrode 42A in the element region 40Aa, and side wall insulating films 33A are formed on the side walls of the gate electrode 32A in the element region 30Aa. Side wall insulating films 53B are formed on the side walls of the gate electrode 52B in the element region 50Ba, side wail insulating films 43B are formed on the side walls of the gate electrode 426 in the element region 40Ba, and side wall insulating films 338 are formed on the side walls of the gate electrode 32B in the element region 30Ba.

Figure 31:
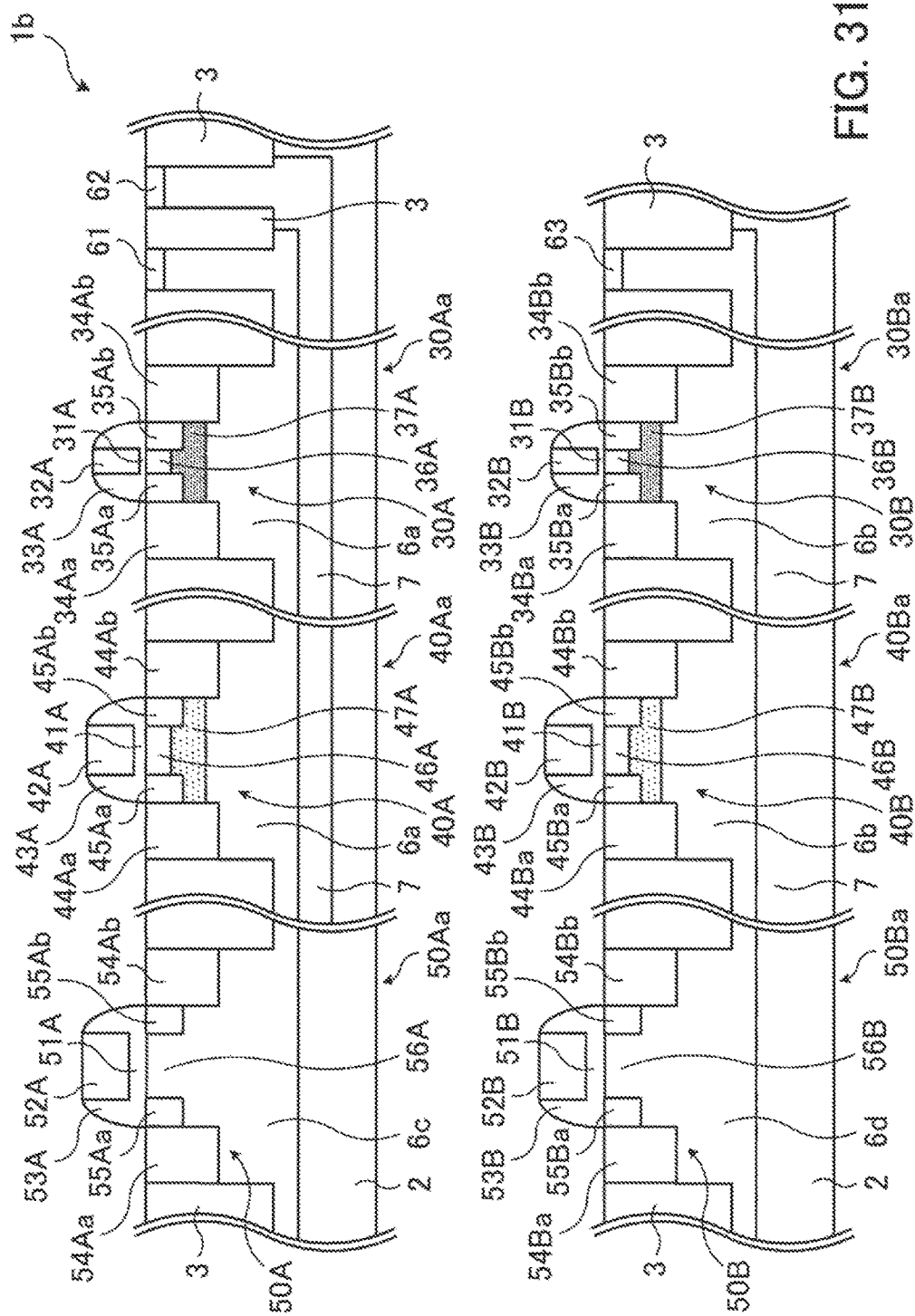
FIG. 31 illustrates an example of a twenty-second manufacturing step for the semiconductor device according to the second embodiment.

FIG. 31 illustrates an example of the twenty-second manufacturing step of the semiconductor device according to the second embodiment (configuration example of the semiconductor device according to the second embodiment).

After the formation of the side wall insulating films 53A and 538, the side wall insulating films 43A and 433, and the side wall insulating films 33A and 33B, impurity implantation is performed by the use of these side wall insulating films as masks (in some parts thereof). Thereby, an n-type impurity region 54Aa and an n-type impurity region 54Ab, an n-type impurity region 44Aa and an n-type impurity region 44Ab, and an n-type impurity region 34Aa and an n-type impurity region 34Ab are formed as illustrated in FIG. 31. Further, a p-type impurity region 54Ba and a p-type impurity region 34Bb, a p-type impurity region 44Ba and a p-type impurity region 44Bb, and a p-type impurity region 34Ba and a p-type impurity region 34Bb are formed as illustrated in FIG. 31.

For example, a resist pattern is formed covering the element region 50Ba, the element region 40Ba, and the element region 30Ba, and having openings in the element region 50Aa, the element region 40Aa, and the element region 30Aa, and then n-type imparity implantation is performed. Thereby, the n-type impurity region 54Aa and the n-type impurity region 54Ab, the n-type impurity region 44Aa and the n-type impurity region 44Ab, and the n-type impurity region 34Aa and the n-type impurity region 34Ab are formed in a lump.

Further, a resist pattern is formed covering the element region 50Aa, the element region 40Aa, and the element region 30Aa, and having openings in the element region 50Ba, the element region 40Ba, and the element region 30Ba, and then p-type impurity implantation is performed. Thereby, the p-type impurity region 54Ba and the p-type impurity region 54Bb, the p-type impurity region 44Ba and the p-type impurity region 44Bb, and the p-type impurity region 34Ba and the p-type impurity region 34Bb are formed in a lump.

These impurity regions function as source regions or drain regions in the I/O transistors 50A and 50B, the very low leak transistors 40A and 40B, and the standard transistors 30A and 30B, respectively.

The kind of impurities, the impurity concentration, and the impurity concentration profile in each of these impurity regions may be set individually, and, in this case, the following method is used, for example.

That is, by means of forming a resist pattern having an opening in the element region 50Aa and implanting n-type impurities, the n-type impurity region 54Aa and the n-type impurity region 54Ab are formed in the element region 50Aa. Further, by means of forming a resist pattern having an opening in the element region 50Ba and implanting p-type impurities, the p-type impurity region 54Ba and the p-type impurity region 54Bb are formed in the element region 50Ba.

Similarly, by means of forming a resist pattern having an opening in in the element region 40Aa and implanting n-type impurities, the n-type impurity region 44Aa and the n-type impurity region 44Ab are formed in the element region 40Aa. Further, by means of forming a resist pattern having an opening in the element region 40Ba and implanting p-type impurities, the p-type impurity region 44Ba and the p-type impurity region 44Bb are formed in the element region 40Ba.

Similarly, by means of forming a resist pattern having an opening in the element region 30Aa and implanting n-type impurities, the n-type impurity region 34Aa and the n-type impurity region 34Ab are formed in the element region 30Aa. Further, by means of forming a resist pattern having an opening in the element region 30Ba and implanting p-type impurities, the p-type impurity region 34Ba and the p-type impurity region 34Bb are formed in the element region 30Ba.

By the above steps, a semiconductor device 1b is obtained in which the I/O transistors 50A and 50B, the very low leak transistors 40A and 40B, and the standard transistors 30A and 30B are mixedly mounted on the common semiconductor substrate 2 as illustrated in FIG. 31. For example, the semiconductor device 1b is obtained in which I/O transistors 50A and 50B having an operating voltage of 3.3 V, very low leak transistors 40A and 40B having an operating voltage of 0.5 V to 0.9 V, and standard transistors 30A and 30B having an operating voltage of 0.5 V to 1.2 V are mixedly mounted. After that, silicide formation, interlayer insulating film formation, plug formation, the formation of upper wiring layers including conductor parts such as a wiring and a via, and the like are performed.

The semiconductor device 1b is operated by means of connecting the very low leak transistor 40A and the standard transistor 30A of the n-channel type to the same power supply, and connecting the very low leak transistor 40B and the standard transistor 30B of the p-channel type to the same power supply, for example, to the same power supply of a low voltage such as 1.0 V or lower.

Further, in the semiconductor device 1b, each of a p-type tap region 61 electrically connected to the p-type well region 6a, an n-type tap region 62 electrically connected to the n-type embedded layer 7, and an n-type tap region 63 electrically connected to the n-type well region 6b is formed as illustrated in FIG. 31.

A predetermined voltage is applied from the p-type tap region 61 to the p-type well region 6a, a predetermined voltage is applied from the n-type tap region 62 to the n-type embedded layer 7. The p-type well region 6a is common between very low leak transistor 40A and the standard transistor 30A of the n-channel type, and a common body bias Vbb is applied to the very low leak transistor 40A and the standard transistor 30A.

Further, a predetermined voltage is applied from the n-type tap region 63 to the n-type well region 6b. The n-type well region 6b is common between the very low leak transistor 40B and the standard, transistor 30B of the p-channel type, and a common body bias Vbb is applied to the very low leak transistor 40B and the standard transistor 30B.

In the semiconductor device 1b, the gate insulating film 41A of the n-channel type very low leak transistor 40A is formed thicker than the gate insulating film 31A of the n-channel type standard transistor 30A. Moreover, the p-type impurity region 47A of the n-channel type very low leak transistor 40A is formed having a lower concentration than the p-type impurity region 37A of the n-channel type standard transistor 30A. Thereby, the very low leak transistor 40A is realized having a sufficiently low off current Xoff compared with the standard transistor 30A.

Similarly, in the semiconductor device 1b, the gate insulating film 41B of the p-channel type very low leak transistor 40B is formed thicker than the gate insulating film 31B of the p-channel type standard transistor 30B. Moreover, the n-type impurity region 47B of the p-channel type very low leak transistor 40B is formed having a lower concentration than the n-type impurity region 37B of the p-channel type standard transistor 30B. Thereby, the very low leak transistor 40B is realized having a sufficiently low off current Ioff compared with the standard transistor 30B.

By adopting the configuration as above, it is possible to realize the semiconductor device 1b having a low power consumption and capable of reducing the off current Ioff, commonizing the body bias Vbb, and operating at a low operating voltage such as 1.0 or lower.

Next, a third embodiment will be explained.

Figure 32:
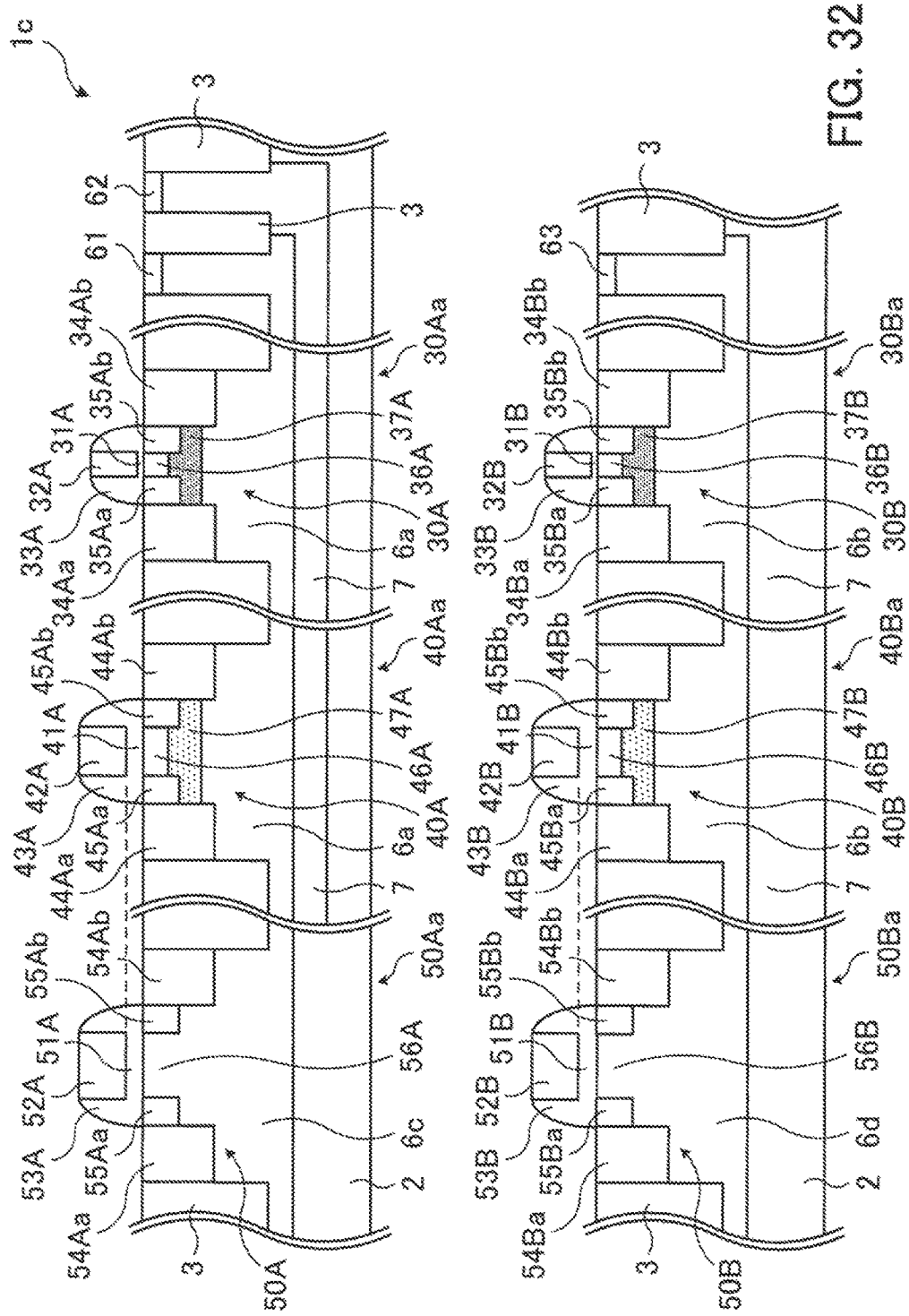
FIG. 32 illustrates a configuration example of a semiconductor de-vice according to a third embodiment.

FIG. 32 illustrates a configuration example of a semiconductor device according to the third embodiment. FIG. 32 schematically illustrates a cross section of a relevant part in an example of the semiconductor device according to the third embodiment.

A semiconductor device 1c illustrated in FIG. 32 has a configuration in which the thickness of the gate insulating film 51A of the n-channel type I/O transistor 50A and the thickness of the gate insulating film 41A of the very low leak transistor 40A are made the same or substantially the same. Similarly, the semiconductor device 1c has a configuration in which the thickness of the gate insulating film 51B of the p-channel type I/O transistor 50B and the thickness of the gate insulating film 41B of the very low leak transistor 40B are made the same or substantially the same. The semiconductor device 1c is different in such a point from the semiconductor device 1b according to the second embodiment. The other configurations are made the same as those of the semiconductor device 1b according to the second embodiment.

Also in this semiconductor device 1c, the very low leak transistor 40A is realized having a sufficiently low off current Ioff compared with the standard transistor 30A and the very low leak transistor 40B is realized having a sufficiently low off current Ioff compared with the standard transistor 30B. The semiconductor device 1c is realized having a low power consumption and capable of operating at a low operating voltage such as 1.0 V or lower.

The manufacturing of the semiconductor device 1c is performed as follows, for example. First, the steps of FIG. 10 to FIG. 17 described in the above second embodiment are performed. Subsequently, according to the example of the step in FIG. 18, an oxide film 9 is formed having a predetermined thickness on the surfaces of the element region 50Aa, the element region 40Aa, the element region 30Aa, the element region 50Ba, the element region 40Ba, and the element region 30Ba. Then, after the selective removal of the oxide film 9 formed in the element region 30Aa and the element region 30Ba according to the example of the step in FIG. 21, re-oxidation is performed according to the example of the step in FIG. 22. Thereby, the gate insulating film 51A and the gate insulating film 41A having equivalent thicknesses are formed in the element region 50Aa and the element region 40Aa, and the gate insulating film 51B and the gate insulating film 41B having equivalent thicknesses are formed in the element region 50Ba and the element region 40Ba. The gate insulating film 31A and the gate insulating film 31B are formed thinner than the above thicknesses in the element region 30Aa and the element region 30Ba. After that, the steps according to the examples in FIG. 23 to FIG. 31 are performed, and thereby the semiconductor device 1c is obtained as illustrated in FIG. 32.

It is possible to achieve reduction in the number of manufacturing steps by making the thicknesses of the gate insulating film 51A and the gate insulating film 41A equivalent to each other and making the thicknesses of the gate insulating film 51B and the gate insulating film 41B equivalent to each other as in the semiconductor device 1c.

Next, a fourth embodiment will be explained.

Figure 33:
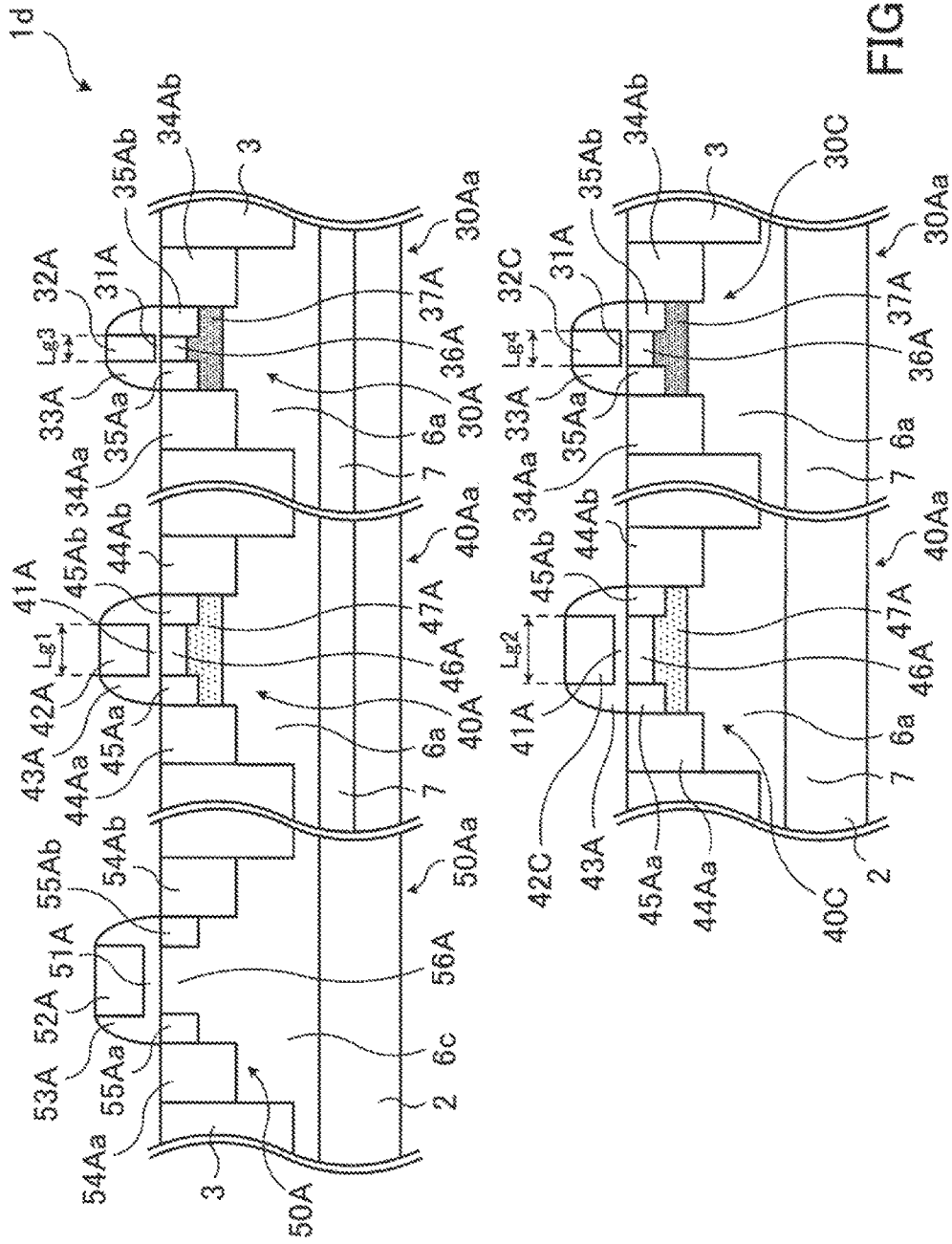
FIG. 33 illustrates a configuration example of a semiconductor device according to a fourth embodiment.

FIG. 33 illustrates a configuration example of a semiconductor device according to the fourth embodiment. FIG. 33 schematically illustrates a cross section of a relevant part in an example of the semiconductor device according to the fourth embodiment.

In a semiconductor device 1d illustrated in FIG. 33, a transistor 40C having a larger gate length than the n-channel type very low leak transistor 40A and a transistor 30C having a larger gate length than the n-channel type standard transistor 30A are further mixedly mounted on the semiconductor substrate 2. The semiconductor device 1d is different in such a point from the semiconductor device 1b according to the above second embodiment. The other configurations are the same as those of the semiconductor device 1b according to the above second embodiment.

The transistor 40C has a gate electrode 42C formed so as to have a larger gate length than the gate electrode 42A of the n-channel type very low leak transistor 40A. In FIG. 33, the gate length of the gate electrode 42A is expressed by Lg1, and the gate length of the gate electrode 42C is expressed by Lg2 (>Lg1). The other configurations are the same as those of the vary low leak transistor 40A. In this manner, by providing the gate electrode 42C having a larger gate length, the transistor 40C in which the off current Ioff is further reduced from the off current Ioff of the very low leak transistor 40A is realized (minimum leak transistor) (FIG. 3, etc.).

The transistor 30C has a gate electrode 32C formed so as to have a larger gate length than the gate electrode 32A of the n-channel type standard transistor 30A. In FIG. 33, the gate length of the gate electrode 32A is expressed by Lg3, and the gate length of the gate electrode 32C is expressed by Lg4 (>Lg3). The other configurations are the same as those of the standard transistor 30A. In this manner, by providing the gate electrode 32C having a larger gate length, the transistor 30C in which the off current Ioff is further reduced from the off current Ioff of the standard transistor 30A is realized (low leak transistor) (FIG. 3, etc.).

The transistor 40C is formed simultaneously with the very low leak transistor 40A, and the transistor 30C is formed simultaneously with the standard transistor 30A.

The transistor 40C and the transistor 30C are connected to the same power supply (e.g., low voltage power supply of 1.0 V or lower) to be operated together with the very low leak transistor 40A and the standard transistor 30A. Further, the common body bias Vbb is applied to the p-type well regions 6a of the transistor 40C and the transistor 30C together with the p-type well regions 6a of the very low leak transistor 40A and the standard transistor 30A.

Note that, while FIG. 33 illustrates the case that both of the transistor 40C and the transistor 30C are further mixedly mounted on the semiconductor substrate 2 for the configuration of the semiconductor device 1c, either one of them may be mixedly mounted.

Further, as described in the above third embodiment, the thickness of the gate insulating film 51A of the n-channel I/O transistor 50A, and the thickness of the gate insulating films 41A of the very low leak transistor 40A and the transistor 40C having an increased gate length may be made equivalent to each other.

Further, FIG. 33 omits the illustration for each of the p-channel type transistors. Similarly, a transistor having a larger gate length than the p-channel type very low leak transistor 40B and a transistor having a larger gate length than the p-channel type standard transistor 30B may be further mixedly mounted on the semiconductor substrate 2.

According to the disclosed technique, it becomes possible to suppress the off current low in a transistor which includes an impurity region having a higher impurity concentration than a channel region to control a threshold voltage under the channel region, and it becomes possible to realize a semiconductor device including such a transistor in which the off current is suppressed low.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention.

Although one or more embodiments of the present invention have been described in detail, it should be understood that various changes, substitutions, and alterations could be made hereto without departing from the spirit and scope of the invention.

What is claimed is:

1. A semiconductor device comprising a first transistor and a second transistor connected to a first power supply, the first transistor including:
   a first gate insulating film provided over a semiconductor substrate;
   a first gate electrode provided over the first gate insulating film;
   a first source region and a first drain region which are provided in the semiconductor substrate respectively on both sides of the first gate electrode and contain impurities of a first conductivity type;
   first impurity regions which are provided on inner sides of the first source region and the first drain region in the semiconductor substrate, respectively, and which contain impurities of the first conductivity type, lower ends of the first impurity regions being located at shallower positions than lower ends of the first source region and the first drain region;
   a first channel region provided in the semiconductor substrate between the first impurity regions; and
   a second impurity region which is provided in the semiconductor substrate under the first channel region and contains impurities of a second conductivity type different from the first conductivity type in a higher concentration than the first channel region, and which comes in directly contact with the first impurity regions, the first source region and the first drain region, and
   the second transistor including:
   a second gate insulating film provided over the semiconductor substrate;
   a second gate electrode provided over the second gate insulating film;
   a second source region and a second drain region which are provided in the semiconductor substrate respectively on both sides of the second gate electrode and contain impurities of the first conductivity type;
   third impurity regions which are provided on inner sides of the second source region and the second drain region in the semiconductor substrate, respectively, and which contain impurities of the first conductivity type, lower ends of the third impurity regions being located at shallower positions than lower ends of the second source region and the second drain region;
   a second channel region provided in the semiconductor substrate between the third impurity regions; and
   a fourth impurity region which is provided in the semiconductor substrate under the second channel region and contains impurities of the second conductivity type in a higher concentration than the second channel region, and which comes in directly contact with the third impurity regions, the second source region and the second drain region, wherein
   a thickness of the first gate insulating film is larger than a thickness of the second gate insulating film; and
   a concentration of the impurities of the second conductivity type contained in the second impurity region is lower than a concentration of the impurities of the second conductivity type contained in the fourth impurity region, and wherein
   the first transistor has a first characteristic in which a first sub-threshold leak current decreases and a first junction leak current increases as a bias being applied to the semiconductor substrate increases;
   the second transistor has a second characteristic in which a second sub-threshold leak current decreases and a second junction leak current increases as a bias being applied to the semiconductor substrate increases;
   in the first transistor, a first sum of the first sub-threshold leak current and the first junction leak current when a first bias is applied to the semiconductor substrate has a first minimum value;
   in the second transistor, a second sum of the second sub-threshold leak current and the second junction leak current when a second bias is applied to the semiconductor substrate has a second minimum value; and
   the first minimum value of the first sum is smaller than the second minimum value of the second sum.

2. The semiconductor device according to claim 1, wherein the first power supply has a voltage not higher than 1 V.

3. The semiconductor device according to claim 1, wherein
a common bias is applied to the semiconductor substrate.

4. The semiconductor device according to claim 1, wherein
a single bias generation circuit is electrically connected to the semiconductor substrate of the first transistor and the second transistor.

5. The semiconductor device according to claim 1 further comprising a third transistor connected to a second power supply having a higher voltage than the first power supply, the third transistor including:
a third gate insulating film which is provided over the semiconductor substrate and has a larger thickness than the first gate insulating film;
a third gate electrode provided over the third gate insulating film; and
a third source region and a third drain region provided in the semiconductor substrate respectively on both sides of the third gate electrode.

6. The semiconductor device according to claim 1 further comprising a third transistor connected to a second power supply having a higher voltage than the first power supply, the third transistor including:
a third gate insulating film which is provided over the semiconductor substrate and has a thickness substantially equal to a thickness of the first gate insulating film;
a third gate electrode provided over the third gate insulating film; and
a third source region and a third drain region provided in the semiconductor substrate respectively on both sides of the third gate electrode.

7. The semiconductor device according to claim 1 further comprising a fourth transistor connected to the first power supply,
the fourth transistor including:
a fourth gate insulating film which is provided over the semiconductor substrate and has a thickness substantially equal to a thickness of the first gate insulating film;
a fourth gate electrode which is provided over the fourth gate insulating film and has a larger gate length than the first gate electrode;
a fourth source region and a fourth drain region which are provided in the semiconductor substrate respectively on both sides of the fourth gate electrode and contain impurities of the first conductivity type;
a fourth channel region provided in the semiconductor substrate between the fourth source region and the fourth drain region, and
a fifth impurity region which is provided in the semiconductor substrate under the fourth channel region and contains impurities of the second conductivity type in a higher concentration of the second conductivity type than the fourth channel region.

8. The semiconductor device according to claim 1, further comprising a fifth transistor connected to the first power supply,
the fifth transistor including:
a fifth gate insulating film which is provided over the semiconductor substrate and has a thickness substantially equal to a thickness of the second gate insulating film;
a fifth gate electrode which is provided over the fifth gate insulating film and has a larger gate length than the second gate electrode;
a fifth source region and a fifth drain region which are provided in the semiconductor substrate respectively on both sides of the fifth gate electrode and contain impurities of the first conductivity type;
a fifth channel region provided in the semiconductor substrate between the fifth source region and the fifth drain region, and
a sixth impurity region which is provided in the semiconductor substrate under the fifth channel region and contains impurities of the second conductivity type in a higher concentration than the fifth channel region.

9. The semiconductor device according to claim 1, wherein
the first bias and the second bias are equal.

10. A semiconductor device comprising a first transistor, a second transistor and a third transistor connected to a first power supply,
the first transistor including:
a first gate insulating film provided over a semiconductor substrate;
a first gate electrode provided over the first gate insulating film;
a first source region and a first drain region which are provided in the semiconductor substrate respectively on both sides of the first gate electrode and contain impurities of a first conductivity type;
a first impurity region which is provided on an inner side of the first source region and the first drain region in the semiconductor substrate and contains impurities of the first conductivity type;
a first channel region provided in the semiconductor substrate between the first source region and the first drain region; and
a second impurity region which is provided in the semiconductor substrate under the first channel region and contains impurities of a second conductivity type different from the first conductivity type in a higher concentration than the first channel region, and which comes in directly contact with the first impurity region, the first source region and the first drain region,
the second transistor including:
a second gate insulating film provided over the semiconductor substrate;
a second gate electrode provided over the second gate insulating film;
a second source region and a second drain region which are provided in the semiconductor substrate respectively on both sides of the second gate electrode and contain impurities of the first conductivity type;
a third impurity region which is provided on an inner side of the second source region and the second drain region in the semiconductor substrate and contains impurities of the first conductivity type;
a second channel region provided in the semiconductor substrate between the second source region and the second drain region; and
a fourth impurity region which is provided in the semiconductor substrate under the second channel region and contains impurities of the second conductivity type in a higher concentration than the second channel region, and which comes in directly contact with the third impurity region, the second source region and the second drain region, wherein a thickness of the first gate insulating film is larger than a thickness of the second gate insulating film; and a concentration of the impurities of the second conductivity type contained in the second impurity region is lower than a concentration of the impurities of the second conductivity type contained in the fourth impurity region, and the third transistor including:

a third gate insulating film which is provided over the semiconductor substrate and has a thickness substantially equal to a thickness of the first gate insulating film;

a third gate electrode which is provided over the third gate insulating film and has a larger gate length than the first gate electrode;

a third source region and a third drain region which are provided in the semiconductor substrate respectively on both sides of the third gate electrode and contain impurities of the first conductivity type;

a third channel region provided in the semiconductor substrate between the third source region and the third drain region; and a fifth impurity region which is provided in the semiconductor substrate under the third channel region and contains impurities of the second conductivity type in a higher concentration of the second conductivity type than the third channel region.

11. The semiconductor device according to claim 10, wherein the first power supply has a voltage not higher than 1 V.

12. The semiconductor device according to claim 10, wherein a common bias is applied to the semiconductor substrate.

13. The semiconductor device according to claim 10, wherein a single bias generation circuit is electrically connected to the semiconductor substrate of the first transistor and the second transistor.

14. The semiconductor device according to claim 10 further comprising a fourth transistor connected to a second power supply having a higher voltage than the first power supply, the fourth transistor including:

a fourth gate insulating film which is provided over the semiconductor substrate and has a larger thickness than the first gate insulating film;

a fourth gate electrode provided over the fourth gate insulating film; and a fourth source region and a fourth drain region provided in the semiconductor substrate respectively on both sides of the fourth gate electrode.

15. A semiconductor device comprising a first transistor, a second transistor and a third transistor connected to a first power supply, the first transistor including:

a first gate insulating film provided over a semiconductor substrate;

a first gate electrode provided over the first gate insulating film;

a first source region and a first drain region which are provided in the semiconductor substrate respectively on both sides of the first gate electrode and contain impurities of a first conductivity type;

a first impurity region which is provided on an inner side of the first source region and the first drain region in the semiconductor substrate and contains impurities of the first conductivity type;

a first channel region provided in the semiconductor substrate between the first source region and the first drain region; and a second impurity region which is provided in the semiconductor substrate under the first channel region and contains impurities of a second conductivity type different from the first conductivity type in a higher concentration than the first channel region, and which comes in directly contact with the first impurity region, the first source region and the first drain region, the second transistor including:

a second gate insulating film provided over the semiconductor substrate;

a second gate electrode provided over the second gate insulating film;

a second source region and a second drain region which are provided in the semiconductor substrate respectively on both sides of the second gate electrode and contain impurities of the first conductivity type;

a third impurity region which is provided on an inner side of the second source region and the second drain region in the semiconductor substrate and contains impurities of the first conductivity type;

a second channel region provided in the semiconductor substrate between the second source region and the second drain region; and a fourth impurity region which is provided in the semiconductor substrate under the second channel region and contains impurities of the second conductivity type in a higher concentration than the second channel region, and which comes in directly contact with the third impurity region, the second source region and the second drain region, wherein a thickness of the first gate insulating film is larger than a thickness of the second gate insulating film; and a concentration of the impurities of the second conductivity type contained in the second impurity region is lower than a concentration of the impurities of the second conductivity type contained in the fourth impurity region, and the third transistor including:

a third gate insulating film which is provided over the semiconductor substrate and has a thickness substantially equal to a thickness of the second gate insulating film;

a third gate electrode which is provided over the third gate insulating film and has a larger gate length than the second gate electrode;

a third source region and a third drain region which are provided in the semiconductor substrate respectively on both sides of the third gate electrode and contain impurities of the first conductivity type;

a third channel region provided in the semiconductor substrate between the third source region and the third drain region; and a fifth impurity region which is provided in the semiconductor substrate under the third channel region and contains impurities of the second conductivity type in a higher concentration than the third channel region.

16. The semiconductor device according to claim 15, wherein the first power supply has a voltage not higher than 1 V.

17. The semiconductor device according to claim 15, wherein a common bias is applied to the semiconductor substrate.

18. The semiconductor device according to claim 15, wherein a single bias generation circuit is electrically connected to the semiconductor substrate of the first transistor and the second transistor.

19. The semiconductor device according to claim 15 further comprising a fourth transistor connected to a second power supply having a higher voltage than the first power supply,
the fourth transistor including:
a fourth gate insulating film which is provided over the semiconductor substrate and has a larger thickness than the first gate insulating film;
a fourth gate electrode provided over the fourth gate insulating film; and
a fourth source region and a fourth drain region provided in the semiconductor substrate respectively on both sides of the fourth gate electrode.

* * * * *